United States Patent [19]

Kanekiyo et al.

[11] Patent Number: 5,320,707
[45] Date of Patent: Jun. 14, 1994

[54] DRY ETCHING METHOD

[75] Inventors: Tadamitsu Kanekiyo; Hironobu Kawahara; Yoshiaki Sato; Kotaro Fujimoto, all of Kudamatsu, Japan

[73] Assignee: Hitachi, Ltd., Tokyo, Japan

[21] Appl. No.: 63,983

[22] Filed: May 20, 1993

Related U.S. Application Data

[60] Continuation-in-part of Ser. No. 987,171, Dec. 8, 1992, which is a continuation-in-part of Ser. No. 638,378, Jan. 7, 1991, Pat. No. 5,200,017, which is a division of Ser. No. 477,474, Feb. 9, 1990, Pat. No. 5,007,981.

[30] Foreign Application Priority Data

Feb. 27, 1989 [JP] Japan .................. 1-42976
Feb. 4, 1992 [JP] Japan .................. 4-17997
Oct. 20, 1992 [JP] Japan .................. 4-281320

[51] Int. Cl.$^5$ ................................ H01L 21/00
[52] U.S. Cl. ........................ 156/665; 156/643; 156/646; 156/664
[58] Field of Search ............... 156/643, 646, 664, 665

[56] References Cited

U.S. PATENT DOCUMENTS 4,505,782 3/1985 Jacob .................. 156/643

FOREIGN PATENT DOCUMENTS 60-234325 11/1985 Japan .
03083337 4/1991 Japan .
04015919 1/1992 Japan .
04092429 3/1992 Japan .
04147621 5/1992 Japan .

*Primary Examiner*—Brian E. Hearn
*Assistant Examiner*—George Goudreau
*Attorney, Agent, or Firm*—Antonelli, Terry, Stout & Kraus

[57] ABSTRACT

Disclosed is a method of dry-etching a sample (e.g., a wafer) having an aluminum system film structure to be etched. Etching is performed in a plasma, under reduced pressure, the plasma being formed from a gas mixture containing a halogen system gas (e.g., $Cl_2$, HBr, $BCl_3$, etc.) and a ROH gas (e.g., $CH_3OH$, $C_3H_5OH$, $C_5H_7OH$, $CH_3COOH$, $HOCH_2CH_2OH$, etc.). By incorporating the ROH gas with the halogen system gas, in etching, e.g., an aluminum system film structure, etching can be performed with an accurate shape corresponding to a mask pattern, irrespective of the pattern density. Moreover, the aluminum system film structure can be etched at a uniform speed irrespective of the pattern density; and a selection ratio for etching the aluminum system film structure, as compared with etching material (e.g., organic resist) of the mask, is improved.

35 Claims, 17 Drawing Sheets

$NH_1OH/CH_3COOH$
BUFFER ACTION ACETIC ACID AMMONIUM
DRY ETCHING METHOD

BACKGROUND OF THE INVENTION

This application is a continuation-in-part application of application Ser. No. 07/987,171, filed Dec. 8, 1992, pending the contents of which are incorporated herein by reference in their entirety, which is a continuation-in-part application of application Ser. No. 07/638,378, filed Jan. 7, 1991, now U.S. Pat. No. 5,200,017 which is a Divisional application of application Ser. No. 477,474, filed Feb. 9, 1990 now U.S. Pat. No. 5,007,981.

This invention relates to a method of processing a sample including an etching step, and more particularly to a processing method which is suitable for processing a sample in the manufacture of a semiconductor device or other device including miniaturized components.

In particular, the present invention relates to a dry etching method, more particularly a dry etching method most suitable for a minute processing technique of an aluminum system material (e.g., aluminum system film structure, such as an aluminum film or aluminum alloy film, or multilayer structure including an aluminum or aluminum alloy film and, e.g., a barrier film) in a semiconductor manufacturing process.

With the remarkable progress in miniaturization in recent years, wiring films have been more and more miniaturized, and an Al-Cu-Si alloy film having a few percent of Cu content in place of the conventional Al-Si alloy film, and a laminate structure of the Al-Cu-Si alloy film and a refractory metal film such as a titanium tungsten (TiW) film, a titanium nitride (TiN) film and a molybdenum silicon (MoSi) film, for reducing contact resistance, have gained wide application as a wiring film in order to prevent breakage due to electromigration and stress migration.

With increase in miniaturization of, e.g., LSI (large-scale integrated) elements, there has been no consideration as to disadvantages of a micro-loading effect in the case of simultaneous processing of different patterns having a large difference in pattern density.

Up to the present, as a gas used for dry-etching an aluminum alloy, for example, there has been known a gas mixture of, for example, $BCl_3$ and $Cl_2$ (boron trichloride and chlorine), $BCl_3 + Cl_2 + N_2$, or $BCl_3 + Cl_2 + CHF_3$. The gas mixture of $BCl_3$ and $Cl_2$ is used for increasing an etching speed; in addition, the gas mixture of $BCl_3 + Cl_2 + N_2$ and $BCl_3 + Cl_2 + CHF_3$ not only increases etching speed, but also improves an anisotropic characteristic of the etching. As to a technique relating to use of the aforementioned gas mixtures as an etching gas, see, for example, Japanese Patent Laid-Open Publication No. Hei 2-71519.

Namely, when the above-discussed gas mixture of $BCl_3 + Cl_2 + N_2$ or $BCl_3 + Cl_2 + CHF_3$, etc., is used, generation of a deposition substance from the $N_2$ or $CHF_3$, which is added for controlling a shape (for example, in case that an aluminum alloy is etching-processed by a plasma formed from a gas mixture of $BCl_3 + Cl_2 + CHF_3$, fluoric substances, such as $Al_xF_y$, are generated as a deposition substance) is large, and a residue is generated on an etching face, as a mask. Such result can be seen from FIGS. 19(a) and 19(b). In the structure shown in FIG. 19(a), numeral 1 is a mask, 2 is an aluminum alloy film, 3 is a base $SiO_2$ film and 4 is a silicon substrate. Residue 5 (see FIG. 19(b)), which is the aforementioned fluoric substance $Al_xF_y$, is generated as a mask on a subjective etching face of the substrate.

An additional objective, which becomes particularly acute with miniaturization of the pattern, is formation of a pattern with vertical sidewalls. Specifically, when using the gas mixture of $BCl_3 + Cl_2 + N_2$ as an etching gas, in a dry etching process utilizing a plasma, a sidewall shape at a wide portion of the pattern width is not formed vertically; accordingly, there is a problem that a satisfactory shape cannot be obtained. This problem is shown in FIGS. 20(a) and 20(b). In connection with FIG. 20(a), 1 is a mask, 2 is an aluminum alloy film, 3 is a base $SiO_2$ film and 4 is a silicon substrate. As seen in FIG. 20(a), where there is a wide distance between mask portions 1, the sidewall shape is not formed vertically.

Further, as shown in FIG. 20(b), when an amount of an addition gas (for example, $N_2$ or $CHF_3$ in the aforementioned gas mixtures) is reduced so as to form vertically the sidewall shape at relatively wide portions of the pattern width, then the sidewall shape at a narrow portion of the pattern width is under-cut; accordingly, a satisfactory shape cannot be obtained.

As seen in the foregoing, it becomes very difficult to find a range wherein the sidewall shape of the etched pattern is vertical, irrespective of the pattern density.

Furthermore, according to prior techniques there has been a problem, in etching aluminum-containing materials having a mask of, e.g., organic resist material thereon, that the etching speed ratio (hereinafter called "resist selection ratio" or "selection ratio"), between the resist as the mask material for forming the wiring pattern and the aluminum or aluminum alloy film as the material to be etched, has been relatively low. Such organic resist material is composed mainly of compounds containing carbon, hydrogen and oxygen. With a relatively low selection ratio, according to various circumstances the resist is eliminated, and even the aluminum or aluminum alloy film beneath the mask would then be etched after elimination of the resist. As a result, it has been a problem that a wiring pattern formed accurately corresponding to the mask has been difficult to achieve.

SUMMARY OF THE INVENTION

It is an object of the present invention to provide a dry etching method wherein a film of an aluminum system material can be etching-processed at a good shape, irrespective of a pattern density.

It is another object of the present invention to provide a dry etching method for etching-processing an aluminum film or an aluminum alloy film, wherein a wiring pattern can be formed accurately and faithfully to the mask.

It is a further object of the present invention to provide a dry etching method wherein a film of an aluminum system material can be etching-processed accurately, with a small difference in etching speed irrespective of a pattern density.

It is a still further object of the present invention to provide a dry etching method wherein a film of an aluminum system material can be etching-processed with an increased selection ratio between the film of the aluminum system material, on the one hand, and a mask (e.g., an organic resist used as a mask) or a base under the film, on the other.

The above and other objects of the present invention and novel features will be clear from the description of the present specification and also from the attached drawings. This description and drawings are not limiting of the present invention, the scope of the present invention being defined by the claims.

Within the invention disclosed in the present application, an outline of a representative example will be explained in the following. This representative example illustrates, and is not limiting of, the present invention, which is defined by the appended claims.

According to one aspect of the present invention, an aluminum system material of a sample is etching-processed in a plasma formed from a gas mixture containing halogen system gas and a ROH gas. The aluminum system material is etched by the halogen system gas, with an aluminum sidewall protection film (deposition substance) being formed by the ROH gas. The deposition substance, which is the aluminum sidewall protection film formed from the ROH gas, adheres easily to the sidewall; accordingly, the aforementioned residue problem is avoided. However, since the amount of the deposition substance generated is relatively small as compared with the amount of deposition substance generated utilizing prior art gas mixtures such as a gas mixture of $BCl_3+Cl_2+N_2$ or $BCl_3+Cl_2+CHF_3$, and the condition change is small, a range for optimum conditions of the ROH gas in the gas mixture, for different pattern widths, is increased, whereby a film of the aluminum system material can be etching-processed with a good and accurate shape, irrespective of the pattern density.

Furthermore, the etchants hardly flow into narrow spaces of the pattern width, so that reaction product is hardly generated and etching speed becomes low thereat. Accordingly, due to the relatively slow etching speed at narrow portions and by adhering the deposition substance at relatively wide portions of the pattern width, a same speed ratio at relatively narrow and relatively wide portions of the pattern width can be achieved.

Moreover, since the range of optimum conditions of gas mixture, for the dry etching, is wide, the film of the aluminum system material can be etching-processed with a good and accurate shape, with a small difference in etching speed, irrespective of the pattern density.

According to another aspect of the present invention, a sample (e.g., a wafer) having an aluminum system film structure is positioned on a sample table in a dry-etching chamber; a plasma is formed in the dry-etching chamber, to perform the dry etching, using an action between (1) an electric field produced by microwaves and (2) a magnetic field. The plasma is produced, and etching performed, under reduced pressure conditions. A high frequency electric power is applied, e.g., to the sample table, so as to cause a bias voltage, to thereby control an incidence energy of ions from the plasma. The plasma is produced from a gas mixture comprising a halogen system gas and a ROH gas.

By utilizing a gas mixture according to the present invention, as the gas mixture for forming the plasma utilized in the dry etching, with a bias voltage applied, e.g., to a sample table on which the sample to be etched is positioned, the bias voltage can be lowered as compared to the bias voltage when using prior art gas mixtures, because the amount of deposition substance formed through use of the gas mixture of the present invention is relatively small; accordingly, the selection ratio can be increased. In this regard, when prior art gas mixtures are utilized for forming the plasma for the dry etching and a bias voltage applied, the bias voltage must be made relatively large due to the relatively large amount of deposition substance formed, whereby the incident energy of ions in the plasma is relatively large, giving rise to damage to the mask and a base on which the aluminum film is formed, and, correspondingly, providing lowering in the selection ratio. This problem is avoided according to the present invention, since the bias voltage can be lowered.

Accordingly, through use of the present invention a film of an aluminum system material (for example, a film of aluminum, or a film of aluminum alloy, or a multilayer laminate of an aluminum or aluminum alloy film and a film of a barrier layer) can be dry etched using a plasma, to form a pattern with a good shape with accurate correspondence to a mask, and with a small difference of etching speed irrespective of a pattern density. Moreover, the film of an aluminum system material can be etching-processed at a good selection ratio with respect to etching of the material of the mask (e.g., an organic resist), or of a base material (e.g., silicon oxide) below the film of aluminum system material.

BRIEF DESCRIPTION OF THE DRAWINGS

Embodiments of the present invention will be described below by way of non-limitative examples with reference to the accompanying drawings, in which.

DESCRIPTION OF THE PREFERRED EMBODIMENTS

In the following, the present invention will be described in connection with preferred embodiments. The present invention is not limited to these preferred embodiments (which are illustrative of the invention), it being intended that the present invention is defined by the full scope of the appended claims and equivalents thereof.

Throughout the present specification, where compositions are described as including or comprising specific components or materials, or where methods are described as including or comprising specific processing steps, it is contemplated by the inventors that such compositions and methods also consist essentially of, or consist of, the recited components or materials or processing steps. Accordingly, throughout the present specification any described composition or method can consist essentially of, or consist of, the recited components or materials or processing steps.

The present invention contemplates a dry etching method, and attendant apparatus used and product formed, wherein a plasma is utilized to effect dry etching of, e.g., an aluminum system material film. The plasma is formed from a gas mixture composed of a halogen system gas (such as $BCl_3$, $Cl_2$, HBr, $Br_3$, etc.) and an ROH gas. The halogen system gas can be known, halogen-containing gases used for dry etching in a plasma system.

As the ROH gas, note that R can be $C_nH_m$, where $n=1, 2$ or $3$ and $m=2n\pm 1$. However, R is not so limited to $C_nH_m$, and can also contain other elements than C and H. For example, ROH can be $CH_3COOH$ (wherein R is $CH_3CO$) or $HOCH_2CH_2OH$ (wherein R is $HOCH_2CH_2$). Generally, R is a carbon-containing chain and can include double and triple bonds between adjacent carbon atoms, as long as the ROH is a gas and a plasma including the ROH forms a protective deposit on side surfaces of the etched aluminum structure, as discussed previously.

While not limiting, the ROH can be included in the gas mixture in an amount of 5–15% by volume, to the total volume of the gas mixture. An illustrative example of a gas mixture is 60 SCCM of $BCl_3$, 90 SCCM of $Cl_2$ and 15 SCCM of $CH_3OH$.

As indicated previously, the present invention provides an improved selection ratio between etching of the aluminum system material film and a material of a mask (for example, an organic resist material). Such resist material can be a known resist.

In the following are shown specific embodiments of the present invention, the description thereof being explained referring to the enclosed drawing figures.

Figure 1:
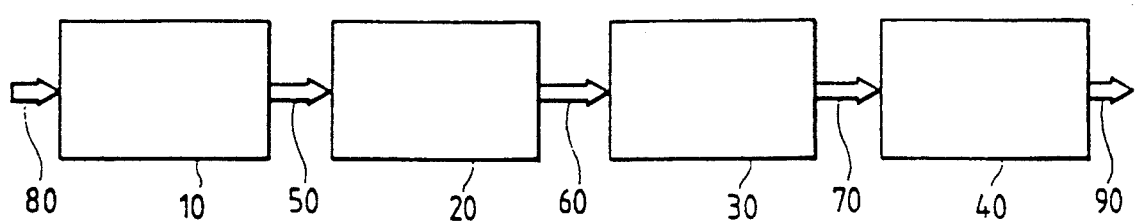
FIG. 1 is a block diagram of a first sample processing apparatus.

In FIG. 1, the sample processing apparatus includes a processing apparatus 10 for etching a sample, a plasma post-processing apparatus 20, a wet-processing apparatus 30 and a dry-processing apparatus 40 and is equipped at least with means 50, 60, 70 for transferring the sample between these processing apparatuses.

In FIG. 1, an apparatus for processing, such as etching, the sample by utilizing plasma under a reduced pressure is used as the processing apparatus 10. Examples of the plasma etching apparatuses which may be employed are a plasma etching apparatus, a reactive sputter etching apparatus, a non-magnetic field type microwave plasma etching apparatus, a magnetic field type microwave plasma etching apparatus, an electron cyclotron resonance (ECR) type microwave plasma etching apparatus, a photo-excitation plasma etching apparatus, a neutral particle etching apparatus, and the like. Besides the apparatuses described above, it is possible to employ an apparatus which wet-etches the sample and an apparatus which etches the sample by use of a corrosive gas.

In FIG. 1, the plasma post-processing apparatus 20 post-processes, such as ashes (i.e. removes photoresist by oxidation), the processed sample processed by the processing apparatus 10 by utilizing plasma under a reduced pressure. Examples of the ash-processing apparatuses which may be employed are a plasma ashing apparatus, non-magnetic field type and magnetic field type microwave plasma ashing apparatuses, an ECR type microwave plasma ashing apparatus, a photo-excitation plasma ashing apparatus, and the like.

In FIG. 1, the wet-processing apparatus 30, such as spinning wet processing apparatus, wet-processes the post-processed sample from the plasma post-processing apparatus 20. In the spinning wet-processing apparatus, the post-processed sample is subjected to spinning washing with water, for example, or to spinning washing sequentially with chemical solutions and water. In this case, the chemical solution is selected suitably in accordance with the materials to be removed from the post-processed sample. An inert gas atmosphere such as nitrogen gas or an atmospheric atmosphere is used as the processing atmosphere. Dry-processing such as water removal is sometimes conducted under this state after wet-processing. According to one aspect of the present invention, a plurality (at least two, e.g., two) of wet-processing stations are represented by wet-processing.

In FIG. 1, an apparatus for dry-processing the wet-processed sample from the wet-processing apparatus 30, such as an apparatus for heating and drying the wet-processed sample or an apparatus for blowing a dry gas on the wet-processed sample to dry it, is used as the dry-processing apparatus 40. A nitrogen gas atmosphere or atmospheric atmosphere is used as the processing atmosphere.

In FIG. 1, the sample transfer means 50 has the function of transferring the processed sample between a processing station (not shown) of the processing apparatus 10 and a processing station (not shown) of the plasma post-processing apparatus 20. The sample transfer means 60 has the function of transferring the post-processed sample between a processing station (not shown) of the plasma post-processing apparatus 20 and a processing station (not shown) of the wet-processing apparatus 30. The sample transfer means 70 has the function of transferring the wet-processed sample between a processing station of the wet-processing apparatus 30 and a processing station (not shown) of the dry-processing apparatus 40. The sample transfer means 50 can deliver and receive the sample between the processing station of the processing apparatus 10 and that of the plasma post-processing apparatus 20. The sample transfer means 60 can deliver and receive the sample between the processing station of the plasma post-processing apparatus 20 and that of the wet-processing apparatus 30. The sample transfer means 70 can deliver and receive the sample between the processing station of the wet-processing apparatus 30 and that of the dry-processing apparatus 40. Known transfer means are used as the sample transfer means 50, 60, 70. Examples of such means include an arm conveyor equipped with sample scooping members that pick up and hold the sample which are rotated or reciprocated mechanically, electrically or magnetically, or with sample grippers or sample adsorbers that grip and hold the sample at their outer peripheral edge by electromagnetic adsorption or vacuum adsorption, for example, a belt conveyor having an endless belt spread between a driving roller and a driven roller, an apparatus for transferring the sample by blow force of gas, and the like. If the processing apparatus 10 is the apparatus which processes the sample by utilizing plasma under a reduced pressure, the sample transfer means 50 is disposed in such a manner that the processed sample can be transferred inside a reduced pressure space without being exposed to the external air.

In this case, there are shown disposed in FIG. 1 the sample transfer means 80, which transfers the sample to be processed by the processing apparatus 10 thereto, and the sample transfer means 90, for transferring the sample dry-processed by the dry-processing apparatus 40 to a recovery cassette (not shown), for example. Sample transfer means analogous to the sample transfer means 50, 60 are used as these sample transfer means 80 and 90.

If the processing apparatus 10 in FIG. 1 processes the sample by utilizing plasma under a reduced pressure, for example, the sample processing atmosphere of the processing apparatus 10 can be put in communication with, and cut off from, the space in which the sample to be processed by the processing apparatus 10 is transferred thereto and the space in which the processed sample is transferred. The sample processing atmosphere of the plasma post-processing apparatus 20, the space in which the processed sample is transferred and the space in which the post-processed sample is transferred can be put in communication with, and cut off from, one another. The space in which the post-processed sample is transferred, the sample wet-processing atmosphere of the wet-processing apparatus 30, the space in which the wet-processed sample is transferred, the sample dry-processing atmosphere of the dry-processing apparatus 40 and the space to which the dry-processed sample is transferred may be maintained in communication with one another or may be put in communication with, and cut off from, one another.

In FIG. 1, the processing station is disposed in the sample processing atmosphere of the processing apparatus 10. If the sample processing apparatus 10 processes the sample by utilizing plasma under a reduced pressure, the processing station is a sample table (not shown). The sample table (not shown) is disposed as the processing station in each of the processing atmosphere of the plasma post-processing apparatus 20, the wet-processing apparatus 30 and the dry-processing apparatus 40. One or a plurality of samples can be put on each sample table. In the processing apparatus 10 and in the plasma post-processing apparatus 20, each sample table is sometimes used as one of the constituent elements forming the sample processing atmosphere.

An embodiment will be explained in further detail with reference to FIGS. 2 and 3.

Figure 2:
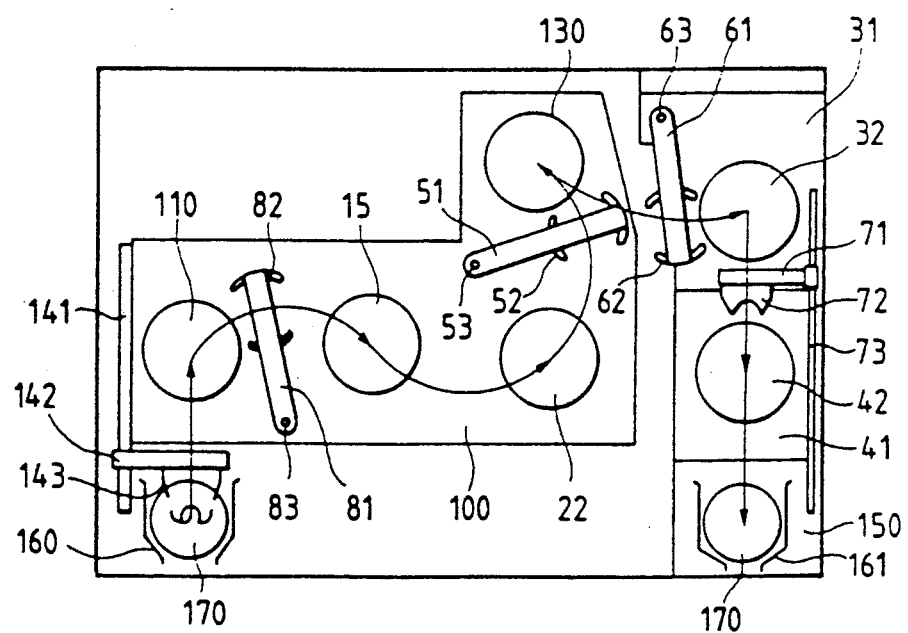
FIG. 2 is a diagrammatic plan view of the apparatus of FIG. 1.
Figure 3:
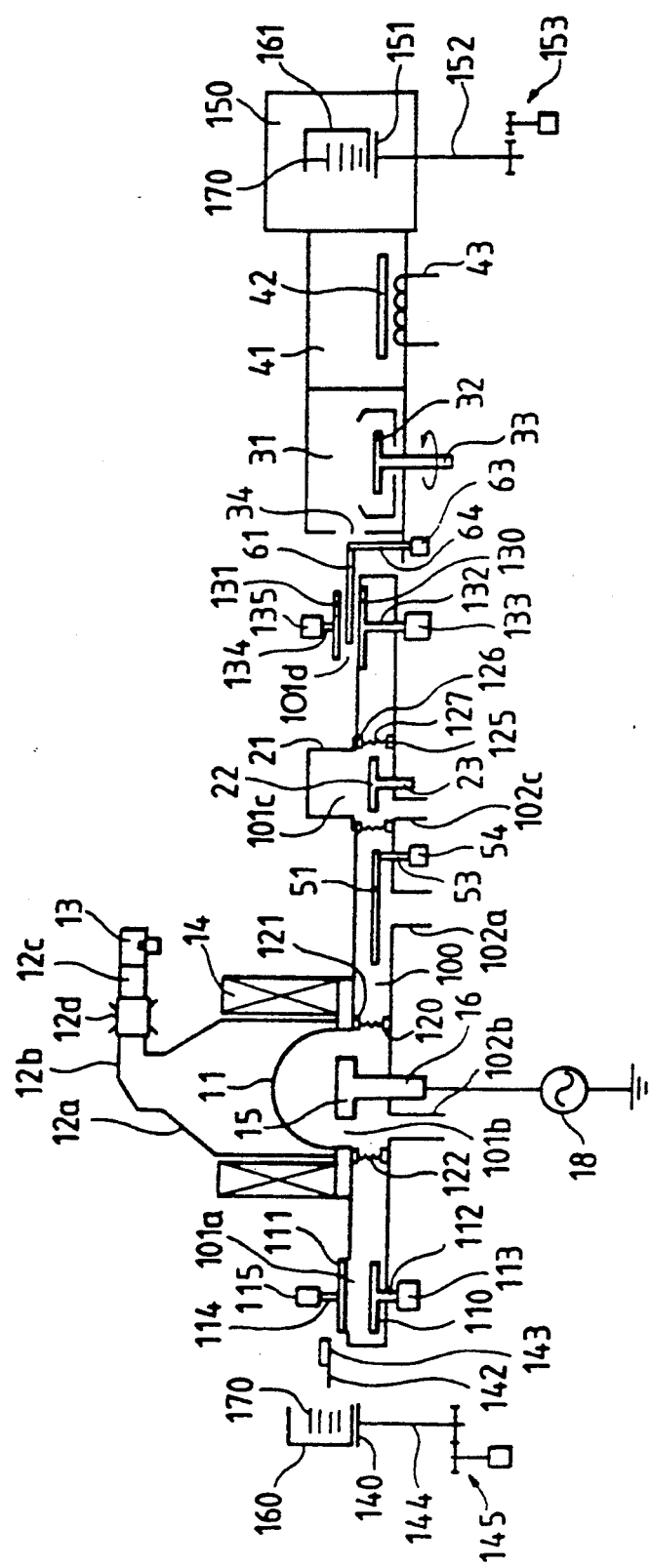
FIG. 3 is a diagrammatic longitudinal side view of the apparatus shown in FIG. 2.

In FIGS. 2 and 3, an apparatus for processing the sample by utilizing plasma under a reduced pressure is used as the processing apparatus in this case.

In FIGS. 2 and 3, four openings 101a, 101b, 101c and 101d are formed in the top wall of a buffer chamber 100. An exhaust nozzle 102a is disposed on the bottom wall of the buffer chamber 100. One of the ends of an exhaust pipe (not shown) is connected to the exhaust nozzle 102a and its other end, to a suction port of an evacuation apparatus (not shown) such as a vacuum pump. The planar shape of the buffer chamber 100 is substantially L-shaped. The buffer chamber 100 is made of a stainless steel in this case. When the buffer chamber 100 is viewed on a plan view, the openings 101a, 101b, 101c are formed from the major side to minor side of the L shape and the opening 101d is formed on the minor side of the L shape. The openings 101a–101d have predetermined gaps between the adjacent pairs of them. An arm 81 is disposed rotatably inside the buffer chamber 100. The arm 81 can rotate in one plane in the buffer chamber 100. A sample scooping member 82 is disposed at the rotating end of the arm 81. The sample scooping member 82 has shaped elements opposed in a plane. The orbit of rotation substantially at the center of the sample scooping member 82 is positioned in such a manner as to substantially correspond to the center of each opening 101a, 101b. In other words, the support point of rotation of the arm 81 is positioned so that almost the center of the sample scooping member 82 describes the orbit of rotation described above. The support point of rotation of the arm 81 is positioned at the upper end of a rotary shaft 83 whose upper end projects at that position into the buffer chamber 100, whose lower end projects outside the buffer chamber 100 and which is disposed rotatably on the bottom wall of the buffer chamber 100 while keeping air-tightness. The lower end of the rotary shaft 83 is connected to rotation driving means (not shown) which is disposed outside the buffer chamber 100 in such a manner as to correspond to the bottom wall of the buffer chamber 100. An arm 51 is disposed rotatably inside the buffer chamber 100 at a position different from that of the arm 81 and on the opposite side of the sample path. The arm 51 can rotate in the same plane in the buffer chamber 100 as the arm 81. A sample scooping member 52 is disposed at the rotating end of the arm 51. The planar shape of the sample scooping member 52 is substantially the same as that of the sample scooping member 82. The arm 51 is disposed in such a manner that the orbit of rotation at the center of the sample scooping member 52 corresponds substantially to the center of each opening 101b, 101c, 101d. In other words, the support point of rotation of the arm 51 is positioned at such a position where almost the center of the sample scooping member 52 describes the orbit of rotation described above. The support point of rotation of the arm 51 is positioned at the upper end of a rotary shaft 53 which is disposed rotatably on the bottom wall of the buffer chamber 100 while keeping air-tightness inside the buffer chamber 100 with its upper end projecting at that position into the buffer chamber 100 and with its lower end projecting outside the buffer chamber 100. The lower end of the rotary shaft 53 is connected to a driving shaft of a rotation driving means disposed outside the buffer chamber 100 so as to correspond to the bottom wall of the buffer chamber 100, such as a driving shaft of a motor 54.

In FIG. 3, a sample table 110 and a cover member 111 are disposed in such a manner as to interpose the opening 101a between them. The sample table 110 has a sample disposition surface on its surface. The planar shape and size of the sample table 110 are such that they can close the opening 101a. The sample table 110 is disposed inside the buffer chamber 100 in such a manner as to be capable of opening and closing the opening 101a, and, in this case, is capable of moving up and down.

An elevation shaft 112 has its axis at the center of the opening 101a with its upper end projecting into the buffer chamber 100 and with its lower end projecting outside the same and is disposed on the bottom wall of the buffer chamber 100 in such a manner that it can move up and down while keeping air-tightness inside the buffer chamber 100. The sample table 110 is disposed substantially horizontally at the upper end of the elevation shaft 112 with its sample disposition surface being the upper surface. The lower end of the elevation shaft 112 is connected to elevation driving means, such as a cylinder rod of a cylinder 113, which is disposed outside the buffer chamber 100 in such a manner as to correspond to the bottom wall of the latter. A seal ring (not shown) is disposed around the outer periphery of the upper surface of the sample table 110 or the inner surface of the top wall of the buffer chamber 100 opposed to the former, that is, on the inner surface of the top wall of the buffer chamber 100 around the opening 101a.

A sample delivery member (not shown) is disposed on the sample table 110. The sample delivery member is disposed in such a manner as to be capable of moving up and down between a position lower than the sample disposition surface of the sample table 110 and a position which projects outward from the opening 101a when the opening 101a is closed by the sample table 110. The planar shape and size of the cover member 111 are such that they can close the opening 101a. The cover member 111 is disposed outside the buffer chamber 100 in such a manner as to be capable of opening and closing the opening 101a, and, in this case, is capable of moving up and down. In the case, an elevation shaft 114 is disposed outside the buffer chamber 100 in such a manner as to be capable of moving up and down with its axis being substantially in conformity with that of the elevation shaft 112. The cover member 111 is disposed substantially horizontally at the lower end of the elevation shaft 114. The upper end of the elevation shaft 114 is connected to elevation driving means, such as a cylinder rod of a cylinder 115, which is disposed above the cover member 111 outside the buffer chamber 100.

A seal ring (not shown) is disposed around the outer periphery of the lower surface of the cover member 111 or the outer surface of the top wall of the buffer chamber 100 opposed to the former, or in other words, around the outer surface of the top wall of the buffer chamber 100 around the opening 101a. The sample table 110 and the cover member 111 are thus doors of an entry airlock of the buffer chamber 100.

A discharge tube 11, whose shape is substantially semi-spherical in this case, is shown disposed hermetically on the top wall of the buffer chamber 100 in FIG. 3. The shape and size of the opening of the discharge tube 11 are substantially the same as those of the opening 101b, and the opening of the discharge tube 11 is substantially in agreement with the opening 101b. The discharge tube 11 is made of an electric insulator such as quartz. A waveguide 12a is disposed outside the discharge tube 11 to surround it. A magnetron 13 as microwave oscillation means and the waveguide 12a are connected by a waveguide 12b. The waveguides 12a and 12b are made of an electric conductor. The waveguide 12b has an isolator 12c and a power monitor 12d. A solenoid coil 14 as magnetic field generation means is disposed outside and around the waveguide 12b.

A sample table 15 is disposed movably up and down inside the space defined inside the buffer chamber 100 and the discharge tube 11. The axis of an elevation shaft 16 is substantially in agreement with the axis of the discharge tube 11 in this case. The elevation shaft 16 is disposed on the bottom wall of the buffer chamber 100, movably up and down, with its upper end projecting into the buffer chamber 100 and with its lower end projecting outside the buffer chamber 100 while keeping air-tightness inside the buffer chamber 100.

Figure 5A:
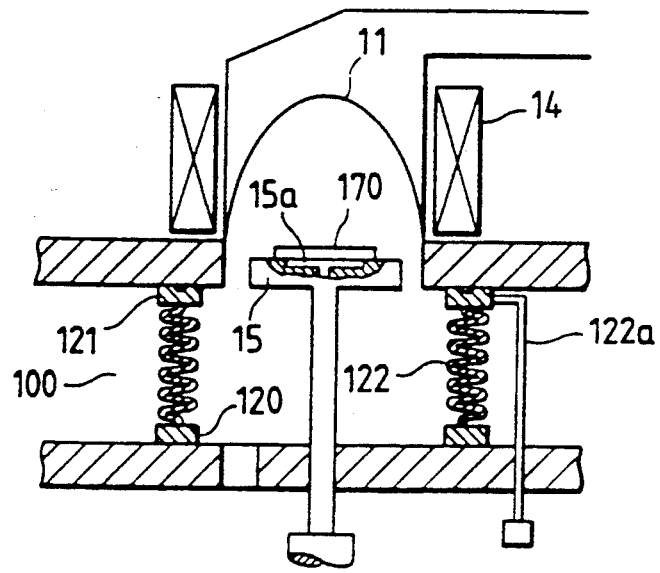
FIGS. 5A and 5B illustrate details of structure and operation of a second part of the apparatus of FIGS. 2 and 3.
Figure 5B:
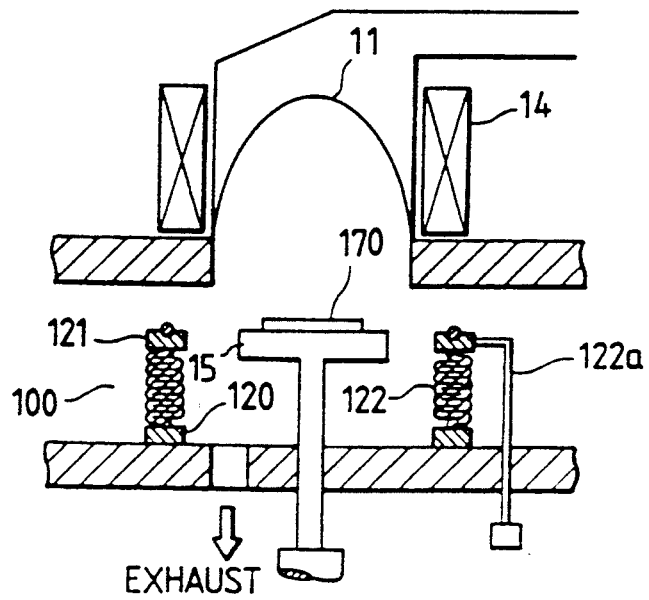

More details of this part of the apparatus are given in FIGS. 5A and 5B, to which reference should be made also.

The sample table 15 has a sample disposition surface on its surface. The planar shape and size of the sample table 15 are such that the sample table 15 can penetrate through the opening 101b. The sample table 15 is disposed substantially horizontally at the upper end of the elevation shaft 16 with its sample disposition surface being its upper surface. The lower end of the elevation shaft 16 is connected to elevation driving means, such as a cylinder rod of a cylinder (not shown), which is disposed outside the buffer chamber 100 in such a manner as to correspond to the bottom wall of the same. In this case, the lower end portion of the elevation shaft 16 is connected to a bias power source, for example, a radio frequency power source 18. The radio frequency power source 18 is disposed outside the buffer chamber 100 and is grounded. In this case, the sample table 15 and the elevation shaft 16 are in an electrically connected state but the buffer chamber 100 and the elevation shaft 16 are electrically isolated.

A sample delivery member 15a (FIG. 5A) is disposed on the sample table 15. The sample delivery member 15a is disposed at a position below the sample disposition surface of the sample table 15 and in such a manner as to be capable of moving up and down with respect to the sample scooping members 82, 52 when the sample disposition surface of the sample table 15 is moved down below the sample scooping member 82 of the arm 81 and the sample scooping member 52 of the arm 51.

The sample table 15 has means for control of temperature. A heat medium flow path is defined inside the sample table 15, for example, and a cooling medium as a heat medium such as cooling water, liquid ammonia, liquid nitrogen, or the like, or a heating medium such as heating gas, is supplied to the flow path. Heat generation means such as a heater, for example, is disposed on the sample table 15.

Flanges 120 and 121 are disposed around the sample table 15 and the elevation shaft 16 inside the buffer chamber 100. The inner diameter and shape of each flange 120, 121 are substantially in conformity with those of the opening 101b. The flange 120 is disposed air-tight on the inner surface of the bottom wall of the buffer chamber 100 with the axis of the elevation shaft 16 being substantially at its center. The flange 121 is disposed in such a manner as to oppose the flange 120. Metallic bellows 122 as extension-contraction cut means are disposed in such a manner as to bridge these flanges 120 and 121.

An elevation shaft 122a is disposed movably up and down with its upper end projecting into the buffer chamber 100 and with its lower end projecting outside the buffer chamber 100 while keeping air-tightness inside the buffer chamber 100. The flange 121 is connected to the upper end of the elevation shaft. The lower end of the elevation shaft is connected to elevation driving means such as a cylinder rod of a cylinder (not shown) disposed outside the buffer chamber 100 in such a manner as to correspond to the bottom wall of the buffer chamber 100.

A seal ring is disposed on the upper surface of the flange 121 or the inner surface of the top wall of the buffer chamber 100 opposing the former, or in other words, on the inner surface of the top wall of the buffer chamber 100 around the opening 101b.

An exhaust nozzle 102b is disposed on the bottom wall of the buffer chamber 100 more inward than the flange 120. One of the ends of an exhaust pipe (not shown) is connected to the exhaust nozzle 102b, and its other end to the suction port of an evacuation apparatus (not shown) such as a vacuum pump. A switch valve (not shown) and a pressure regulating valve such as a variable resistance valve (not shown) are disposed in the exhaust pipe. One of the ends of a gas introduction pipe (not shown) is connected to a processing gas source (not shown), and its other end opens into the discharge tube 11, or the like. A switch valve and a gas flow rate regulator (not shown) are disposed in the gas introduction pipe.

In FIG. 3, the plasma post-processing chamber 21 is hermetically disposed on the top wall of the buffer chamber 100. The shape and size of the opening of the plasma post-processing chamber 21 are substantially in agreement with those of the opening 101c, and the opening of the plasma post-processing chamber 21 is substantially in agreement with the opening 101c. A sample table 22 is disposed in the space defined by the interior of the buffer chamber 100 and that of the plasma post-processing chamber 21. A support shaft 23 in this case uses the axis of the plasma post-processing chamber 21 as its axis. It is disposed on the bottom wall of the buffer chamber 100 with its upper end projecting into the buffer chamber 100 and with its lower end projecting outside the buffer chamber 100 while keeping air-tightness inside the buffer chamber 100.

The sample table 22 has a sample disposition surface on its surface. The planar shape and size of the sample table 22 are smaller than those of the opening 101c in this case. The sample table 2 is disposed substantially horizontally at the upper end of the support shaft 23 with its sample disposition surface being the upper surface. The sample disposition surface of the sample table 2 is positioned below the sample scooping member 52 of the arm 51.

A sample delivery member (not shown) is disposed on the sample table 22. In other words, the sample delivery member is disposed movably up and down between a position lower than the sample disposition surface of the sample table 22 and a position higher than the sample scooping member 52 of arm 51.

Flanges 125 and 126 are disposed outside the sample table 22 and the support shaft 23 but inside the buffer chamber 100. The inner diameter and shape of each flange 125, 126 are substantially in conformity with those at the opening 101c. The flange 125 is disposed hermetically on the inner surface of the bottom wall of the buffer chamber 100 substantially coaxial with the axis of the support shaft 23. The flange 126 opposes the flange 125. Metallic bellows 127 as extension-contraction cut means bridge between these flanges 125 and 126. An elevation shaft (not shown) is disposed movably up and down on the bottom wall of the buffer chamber 100 with its upper end projecting into the buffer chamber 100 and with its lower end projecting outside the buffer chamber 100 while keeping air-tightness inside the buffer chamber 100.

The flange 126 is connected to the upper end of the elevation shaft. The lower end of the elevation shaft is connected to elevation driving means such as a cylinder rod of a cylinder (not shown) which is disposed outside the buffer chamber 100 so as to correspond to the bottom wall of the buffer chamber 100 A seal ring (not shown) is disposed on the upper surface of the flange 126 or the inner surface of the top wall of the buffer chamber 100 opposing the upper surface of the flange 126, or, in other words, on the inner surface of the top wall of the buffer chamber 100 around the opening 101c. An exhaust nozzle 102c is disposed on the bottom wall of the buffer chamber 100 which is more inward than the flange 125. One of the ends of an exhaust pipe (not shown) is connected to the exhaust nozzle 102c, and its other end to the suction port of an evacuation apparatus (not shown) such as a vacuum pump.

In FIG. 3, a sample table 130 and a cover member 131 are disposed in such a manner as to interpose the opening 101d between them. This part of the apparatus and its operation are shown in more detail in FIGS. 4A–G, to which reference should be made also. The sample table 130 has a sample disposition surface on its surface. The planar shape and size of the sample table 130 are such that the sample table 130 can sufficiently close the opening 101d. The sample table 130 is disposed movably up and down, in this case, inside the buffer chamber 100 in such a manner as to be capable of opening and closing the opening 101d. In this case, an elevation shaft 132 is disposed movably up and down on the bottom wall of the buffer chamber 100 with its upper end projecting into the buffer chamber 100 and with its lower end projecting outside the buffer chamber 100 while keeping air-tightness inside the buffer chamber 100. The sample table 130 is disposed substantially horizontally at the upper end of the elevation shaft 132 with its sample disposition surface being the upper surface. The lower end of the elevation shaft 132 is connected to elevation driving means such as a cylinder rod of a cylinder 133 which is disposed outside the buffer chamber 100 in such a manner as to correspond to the bottom wall of the buffer chamber 100.

A seal ring is disposed around the outer peripheral edge of the upper surface of the sample table 130 (as shown) or the inside of the top wall of the buffer chamber 100 opposing the outer peripheral edge, that is, on the inner surface of the top wall of the buffer chamber 100 around the opening 101d. A sample delivery member 130a is disposed on the sample table 130. It is disposed movably up and down between a position lower than the sample disposition surface of the sample table 130 and a position projecting outward from the opening 101d under the state where the opening 101d is closed by the sample table 130.

The planar shape and size of a cover member 131 are such that the cover member 131 can open and close the opening 101d. It is disposed movably up and down, in this case, outside the buffer chamber 100. The axis of an elevation shaft 134 is substantially in agreement with that of the elevation shaft 132, in this case. This elevation shaft 134 is disposed movably up and down outside the buffer chamber 100. The cover member 131 is disposed substantially horizontally at the lower end of the elevation shaft 134. The upper end of the elevation shaft 134 is connected to elevation driving means such as a cylinder rod of a cylinder 135 which is disposed at a position above the cover member 131 outside the buffer chamber 100. A seal ring is disposed around the outer peripheral edge of the lower surface of the cover member 131 (as shown) or the outer surface of the top wall of the buffer chamber 100 opposing the former, that is, the outer surface of the top wall of the buffer chamber 100 around the opening 101d. The sample table 130 and the cover member 131 thus constitute doors of an exit airlock for the buffer chamber 100.

A cassette table 140 is disposed movably up and down in such a manner as to correspond to the side surface of the L-shaped major side of the buffer chamber 100 outside the buffer chamber 100. A guide 141 is disposed outside the buffer chamber 100 in such a manner as to extend linearly along the side surface of the L-shaped major side in its transverse direction. The edge of this guide 141 on the side of the cassette table 140 is extended so as to correspond to the center of the cassette table 140, in this case. An arm 142 is a linear member in this case, and one of its ends is disposed on the guide 141 in such a manner as to be capable of reciprocation while being guided by the guide 141. A sample scooping number 143 is disposed at the other end of the arm 142. The cassette table 140 is disposed substantially horizontally at the upper end of an elevation shaft 144 with a cassette disposition surface being its upper surface. The lower end of the elevation shaft 144 is connected to elevation driving means 145.

The wet-processing chamber 31, the dry-processing chamber 41 and a sample recovery chamber 150 are disposed outside the buffer chamber 100, in this case. They form a unit connectable to and disconnectable from the buffer chamber unit. The wet-processing chamber 31, the dry-processing chamber 41 and the sample recovery chamber 150 are aligned sequentially along the side walls on the side of the openings 101c, 101d of the buffer chamber 100 in this case. Among them, the wet-processing chamber 31 is disposed at the position closest to the opening 101d.

A sample table 32 is disposed inside the wet-processing chamber 31. A support shaft 33 is disposed rotatably on the bottom wall of the wet-processing chamber 31 with its upper end projecting into the wet-processing chamber 31 and with its lower end projecting outside the wet-processing chamber 31 in such a manner as to keep air-tightness and water-tightness inside the wet-processing chamber 31 in this case. The lower end of the support shaft 33 is connected to a rotary shaft of a motor (not shown) as a rotation driving means, for example.

The sample table 32 has a sample disposition surface on its surface. The sample table 32 is disposed substantially horizontally at the upper end of the support shaft 33 with the sample disposition surface being its upper surface. The sample disposition surface of the sample table 32 is positioned below a sample scooping member 62 of an arm 61.

The sample table 32 is equipped with a sample delivery member (not shown). The sample delivery member is disposed movably up and down between a position below the sample disposition surface of the sample table 32 and a position above the sample scooping member 62 of the arm 61. A processing liquid feed pipe (not shown) is disposed inside the wet-processing chamber 31 in such a manner as to be capable of supplying a processing solution to the sample disposition surface of the sample table 32. A processing solution feed apparatus (not shown) is disposed outside the wet-processing chamber 31. The processing solution feed pipe is connected to this processing solution feed apparatus. A waste liquor discharge pipe (not shown) is connected to the wet-processing chamber 31. In this case, inert gas introduction means (not shown) for introducing an inert gas such as nitrogen gas into the wet-processing chamber 31 are provided.

In FIGS. 2 and 3, the arm 61 is disposed rotatably so as to correspond to the sample tables 130 and 32. The arm 61 can rotate on the same plane outside the buffer chamber 100. The sample scooping member 62 is disposed at the rotating end of the arm 61. The planar shape of the sample scooping member 62 is substantially the same as those of the sample scooping members 52 and 82. The arm 61 is disposed in such a manner that the orbit of rotation of the center of the sample scooping member 62 corresponds substantially to the centers of the sample tables 130 and 32, respectively. In other words, the support point of rotation of the arm 61 is positioned to a position where almost the center of the sample scooping member 62 describes the orbit of rotation described above.

The support point of rotation of the arm 61 is disposed at the upper end of the rotary shaft 63 disposed rotatably outside the buffer chamber 100 and outside the wet-processing chamber 31. The lower end of the rotary shaft 63 is connected to the driving shaft of a motor 64, for example, as a rotation driving means. An opening 34 is bored on the side wall of the wet-processing chamber 31 that corresponds to the rotation zones of the arm 61 and sample scooping member 62. The size and position of the opening 34 are such that they do not prevent the entry and exit operations of the arm 61 and sample scooping member 62 with respect to the wet-processing chamber 31. The opening 34 can be opened and closed by switch means (not shown) in this case.

A sample table 42 is disposed inside the dry-processing chamber 41. The sample table 42 has a sample disposition surface on its surface. It is disposed substantially horizontally on the bottom wall of the dry-processing chamber 41. A heater 43 is used as heating means in this case. The heater 43 is disposed on the back of the sample table 42 in such a manner as to be capable of heating the sample table 42. It is connected to a power source (not shown).

The sample disposition surface of the sample table 42 is positioned below a sample scooping member 72 of an arm 71. A sample delivery member (not shown) is disposed on the sample table 42. In other words, the sample delivery member is disposed movably up and down between a position below the sample disposition surface of the sample table 42 and a position above the sample scooping member 72 of the arm 71. In this case, the sample delivery member, too, is capable of moving up and down between a position below the sample disposition surface of the sample table 32 and a position above the sample scooping member 72 of the arm 71. In this case, there is provided inert gas introduction means (not shown) for introducing an inert gas such as nitrogen gas into the dry-processing chamber 41.

A cassette table 151 is disposed inside a sample recovery chamber 150. An elevation shaft 152 is disposed movably up and down on the bottom wall of the sample recovery chamber 150 with its upper end projecting into the sample recovery chamber and with its lower end projecting outside the sample recovery chamber 150. The cassette table 151 is disposed substantially horizontally at the upper end of the elevation shaft 152 with a cassette disposition surface being its upper surface. The lower end of the elevation shaft 152 is disposed on elevation driving means 153. In this case, inert gas introduction means (not shown) are arranged so as to introduce an inert gas such as nitrogen gas into the sample recovery chamber 150.

In FIG. 2, a guide 73 is disposed along the inner wall surface of each of the wet-processing chamber 31, the dry-processing chamber 41 and the sample recovery chamber 150. The guide 73 has a linear shape. In other words, the line passing through the centers of the sample tables 32, 42 and the cassette table 151 is a straight line and the guide 73 is disposed substantially parallel to this line. The arm 71 is a linear member in this case and one of its ends is disposed on the guide 73 so as to be capable of reciprocation while being guided by the guide 73. A sample scooping member 72 is disposed at the other end of the arm 71.

Openings (not shown) are formed on the side walls of the wet- and dry-processing chambers 31, 41 and the sample recovery chamber 150 corresponding to the reciprocation zones of the arm 71 and the sample scooping member 72, respectively, so that the arm 71 and the sample scooping member 72 are not prevented from coming into and out from the wet-processing chamber 31, the dry-processing chamber 41 and the sample recovery chamber 150, respectively. These openings can be opened and closed by switch means (not shown), respectively. An opening for loading and discharging a cassette and a door (not shown) are disposed in the sample recovery chamber 150.

A cassette 160 is disposed on a cassette table 140. It can store a plurality of samples 170 one by one stacked in the longitudinal direction, and one of its side surfaces is open in order to take out the samples 170 from the cassette 160. The cassette 160 is disposed on the cassette table 140 with its sample take-out side surface facing the opening 101a. The cassette table 140 supporting the cassette 160 thereon is moved down, for example, under this state. Descent of the cassette table 140 is stopped at the position where the sample 170 stored at the uppermost stage of the cassette 160 can be scooped up by the sample scooping member 143.

The operation of this apparatus is as follows:

The openings 101a and 101d are closed by the sample tables 110 and 130, respectively, and when an evacuation apparatus is operated under this state, the inside of the buffer chamber 100 is evacuated to a predetermined pressure. Thereafter, the cover member 111 is moved up and this ascent is stopped at the position where the sample scooping member 143 for scooping up the sample 170 is not prevented from reaching the opening 101a. The arm 142 is moved towards the cassette 160 under this state and this movement is stopped at the position where the sample scooping member 143 corresponds to the back of the sample 170 stored at the lowermost stage of the cassette 160, for example. Thereafter the cassette 160 is moved up by the distance at which the sample scooping member 143 can scoop up the sample 170. In this manner the sample 170 is scooped up on its back by the sample scooping member 14 and delivered to the sample scooping member 143.

When the sample scooping member 143 receives the sample 170, the arm 142 is moved towards the opening 101a. This movement of the arm 142 is stopped at the point where the sample scooping member 143 having the sample 170 reaches the position corresponding to the opening 101a. Under this state the sample delivery member of the sample table 110 is moved up so that the sample 170 is delivered from the sample scooping member 143 to the sample delivery member. Thereafter, the sample scooping member 143 is retreated to the position at which it does not prevent descent of the sample delivery member receiving the sample 170 by the movement of the arm 142.

Thereafter the sample delivery member having the sample 170 is moved down and the sample 170 is delivered from the sample delivery member to the sample table 110 and placed on its sample disposition surface. Then, the cover member 111 is moved down. Accordingly, the opening 101a is closed by the cover member 111 and its communication with the outside is cut off. Thereafter, the sample table 110 having the sample 170 is moved down and this downward movement is stopped at the point where the sample table 110 reaches the position at which the sample 170 can be exchanged between the sample delivery member of the sample table 110 and the sample scooping member 82 of the arm 81.

The flange 121 and the metallic bellows 122 are moved down by the shaft 122a lest they prevent the rotation of the arm 81 and the sample scooping member 32 and the sample table 15 is moved down to the position where its sample delivery member 15a and the sample scooping member 82 of the arm 81 can exchange the sample 170 between them. Under this state the sample delivery member 15a is moved up so that it can exchange the sample 170 with the sample scooping member 82 of the arm 81. The arm 81 is then rotated in the direction of the sample table 110 and the sample scooping member 82 is located at the position which corresponds to the back of the sample 170 held by the sample delivery member of the sample table 110 and at which it can scoop up the sample 170. Under this state the sample delivery member of the sample table 110 is moved down and the sample 170 is delivered to the sample scooping member 82 of the arm 81. After scooping up the sample 170, the sample scooping member 82 is rotated in the direction of the sample table 15 while passing between the flange 121 and the inner surface of the top wall of the buffer chamber 100 as the arm 81 is rotated in the direction of the sample table 15.

The sample table 110 is moved up once again so that the opening 101a is closed by the sample table 110. The rotation of the sample scooping member 82 described above is stopped when the sample scooping member 82 reaches the position where the sample 170 can be exchanged between the sample scooping member 82 and the sample delivery member 15a of the sample table 15. The sample delivery member 15a of the sample table 15 is moved up under this state so that the sample 170 is delivered from the sample scooping member 82 to the sample delivery member 15a of the sample table 15. Thereafter, when the arm 81 is rotated to the position between the openings 101a and 101b, the sample scooping member 82 is brought into the stand-by state to prepare for the next delivery of the sample between the sample tables 110 and 15.

Thereafter the flange 121 and the metallic bellows 122 are moved up by the shaft 122a so that communication of the buffer chamber 100 in the metallic bellows 122 and the inside of the discharge tube 11 with the interior of the buffer chamber 100 outside the metallic bellows 122 is cut off. When the sample delivery member 15a of the sample table 15 receiving the sample 170 is moved down, the sample 170 is delivered from the sample delivery member 15a of the sample table 15 to the sample table 15 and is placed on the sample disposition surface of the sample table 15. After receiving the sample 170 on its sample disposition surface, the sample table 15 is moved up to a predetermined position (see FIG. 5A) inside the space where communication with the buffer chamber 100 outside the metallic bellows 122 is cut off.

A predetermined processing gas is introduced at a predetermined flow rate from the processing gas source into the space in which communication with the buffer chamber 100 outside the metallic bellows 122 is cut off. Part of the processing gas introduced into this space is exhausted outside the space due to the operations of the evacuation apparatus and the variable resistance valve. In this manner the pressure of this space is controlled to a predetermined pressure for etching treatment.

The magnetron 13 oscillates a 2.45 GHz microwave in this case. The microwave thus oscillated propagates through the waveguides 12b and 12a through the isolator 12c and the power monitor 12d and is absorbed by the discharge tube 11, thereby generating a radio frequency field containing the microwave. At the same time, the solenoid coil 14 is operated to generate a magnetic field. The processing gas existing inside the space where communication with the buffer chamber 100 outside the metallic bellows 122 is cut off is converted to plasma due to the synergistic operations of the radio frequency field containing the microwave and the magnetic field. The sample 170 disposed on the sample table 15 is etched by utilizing this plasma.

Thereafter the sample table 15 and the flange 121 are moved downwardly (FIG. 5B) and the sample delivery member 15a is moved upwardly.

The rotation of the sample scooping member 52 is stopped at the point when the sample scooping member 52 reaches the position where the etched sample 170 can be exchanged between the sample scooping member 52 and the sample delivery member 15a of the sample table 15. The sample delivery member 15a of the sample table 15 is moved down under this state and the etched sample 170 is delivered from the sample delivery member 15a of the sample table 15 to the sample scooping member 52 of the arm 51. After scooping up the etched sample 170, the sample scooping member 52 is rotated in the direction of the sample table 22 while passing between the flange 121 and the inner surface of the top wall of the buffer chamber 100 as the arm 51 is rotated in the direction of the sample table 22.

A new sample in the cassette 160 is placed by the operations described above on the sample table 15 from which the etched sample 170 is removed. The new sample placed on the sample table 15 is subsequently etch-processed due to the operations described above.

Before, or during, the rotation of the sample scooping member 52 having the etched sample 170, the flange 126 and the metallic bellows 127 are moved down lest they prevent the rotation of the arm 51 and the sample scooping member 52. The radio frequency power source 18 is operated at the time of etching of the sample 170, a predetermined radio frequency power is applied to the sample table 15 through the elevation shaft 16 and a predetermined radio frequency bias is applied to the sample 170. The sample 170 is adjusted to a predetermined temperature through the sample table 15.

The operations of the magnetron 13, solenoid coil 14 and radio frequency power source 18, and the like, are stopped at the point where etching of the sample 170 is complete, and introduction of the processing gas into the space whose communication with the inside of the buffer chamber 100 outside the metallic bellows 122 is cut off is stopped. After evacuation of this space is conducted sufficiently, the switch valve constituting the evacuation means is closed. Thereafter, the flange 121 and the metallic bellows 122 are moved down so as not to prevent the rotation of the arm 51 and the sample scooping member 52 and the sample table 15 is moved down to the position where its sample delivery member and the sample scooping member 52 of the arm 51 can exchange the etched sample 170. The sample delivery member of the sample table 15 is then moved up so that it can exchange the etched sample 170 with the sample scooping member 52 of the arm 51. When the arm 51 is rotated under this state in the direction of the sample table 15, the sample scooping member 52 passes between the flange 121 and the inner surface of the top wall of the buffer chamber 100 and is rotated in the direction of the sample table 15.

The sample scooping member 52 having the etched sample 170 is rotated in the direction of the sample table 22 while passing between the flange 126 and the inner surface of the top wall of the buffer chamber 100 when the arm 51 is rotated further in the direction of the sample table 22. Such a rotation of the sample scooping member 52 is stopped when the sample scooping member 52 reaches the position where the etched sample 170 can be exchanged between the sample scooping member 52 and the sample delivery member of the sample table 22. The sample delivery member of the sample table 22 is moved up under this state and the etched sample 170 is delivered from the sample scooping member 52 to the sample delivery member of the sample table 22. Thereafter the sample scooping member 52 is rotated to the position between the openings 101c and 101d and is brought into the stand-by state.

Thereafter, the flange 126 and the metallic bellows 127 are moved up and the interior of the buffer chamber 100 inside the metallic bellows 127 and the interior of the plasma post-processing chamber 21 are cut off from communication with the interior of the buffer chamber 100 outside the metallic bellows 127. When the sample delivery member of the sample table 22 receiving the etched sample 170 is moved down, the etched sample 170 is delivered from the sample delivery member of the sample table 22 to the sample table 22 and is placed on the sample disposition surface of the sample table 22.

The post-processing gas is introduced at a predetermined flow rate into the space whose communication with the interior of the buffer chamber 100 outside the metallic bellows 127 is cut off, and part of the post-processing gas is exhausted from this space. In this manner the pressure of this space is adjusted to a predetermined post-processing pressure. Thereafter, the post-processing gas existing in this space is converted in this case to plasma due to the operation of a radio frequency field containing a microwave. The etched sample 170 placed on the sample table 22 is post-processed by utilizing this plasma.

After the post-processing of the etched sample is thus complete, introduction of the post-processing gas into the space, which is cut off from the interior of the buffer chamber 100 outside the metallic bellows 127, and conversion to plasma of the post-processing gas are stopped. Then, the flange 126 and the metallic bellows 127 are moved down lest they prevent the rotation of the arm 51 and the sample scooping member 52.

The sample scooping member 52 that is under the stand-by state between the openings 101c and 101d is rotated to the position which does not prevent the rise of the post-processed sample 170 on the sample table 22 and which has passed the sample table 22. The sample delivery member of the sample table 22 is moved up under this state so that the post-processed sample 170 placed on the sample table 22 is delivered to the sample delivery member of the sample table 22. Then, when the arm 51 is rotated in the direction of the sample table 22, the sample scooping member 52 is located to the position at which it can scoop up the sample 170, so as to correspond to the back of the post-processed sample 170 held by the sample delivery member of the sample table 22. The sample delivery member of the sample table 22 is moved down under this state and the post-processed sample 170 is delivered from the sample delivery member of the sample table 22 to the sample scooping member 52 of the arm 51.

After receiving the post-processed sample 170, the sample scooping member 52 is rotated in the direction of the sample table 130 while passing between the flange 126 and the inner surface of the top wall of the buffer chamber 100 when the arm 51 is rotated in the direction of the sample table 130. After the post-processed sample 170 is removed, the next etched sample is placed on the sample table 22 and is then post-processed by utilizing plasma.

Figure 4A:
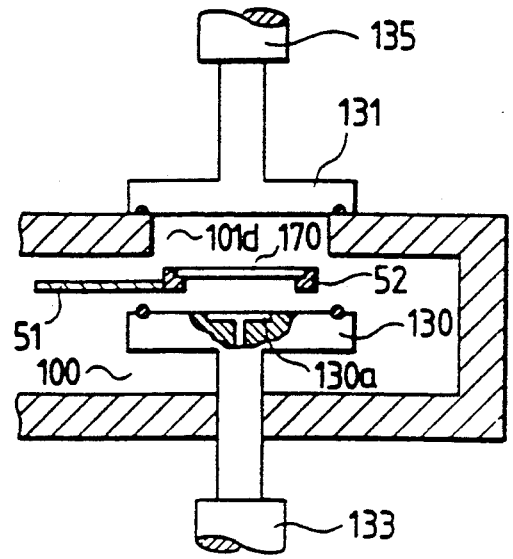
FIGS. 4A-4G illustrate details of structure and operation of one part of the apparatus of FIGS. 2 and 3.
Figure 4B:
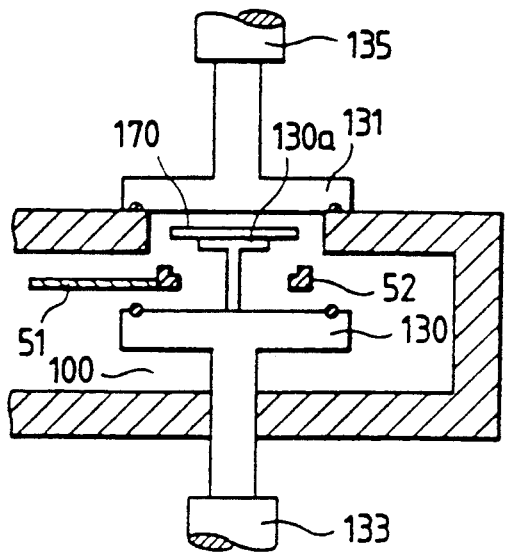

Before, or during, the rotation of the sample scooping member 52 having the post-processed sample 170 as described above, the sample table 130 is moved down to the position at which its sample delivery member 130a and the sample scooping member 52 of the arm 51 can exchange the post-processed sample 170. The rotation of the sample scooping member 52 is stopped when it reaches the position at which the post-processed sample 170 can be exchanged between the sample scooping member 52 and the sample delivery member 130a of the sample table 130 (FIG. 4A). The sample delivery member 130a of the sample table 130 is moved up under this state so that the post-processed sample 170 is delivered from the sample scooping member 52 to the sample delivery member 130a of the sample table 130 (FIG. 4B).

Thereafter, when the arm 51 is rotated to the position between the openings 101b and 101c, the sample scooping member 52 is brought into the stand-by state at that position in order to transfer the next etched sample to the sample table 22.

Figure 4C:
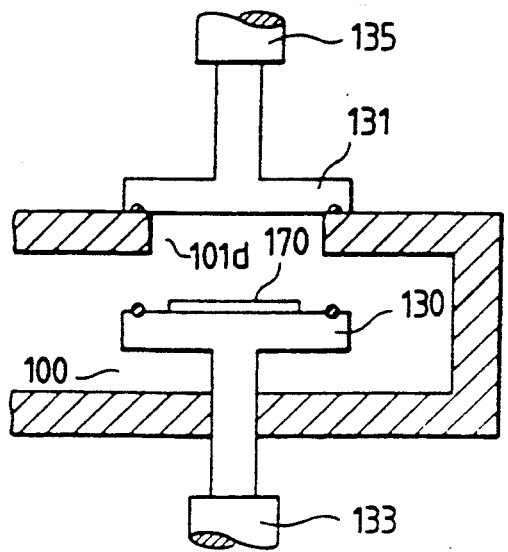
Figure 4D:
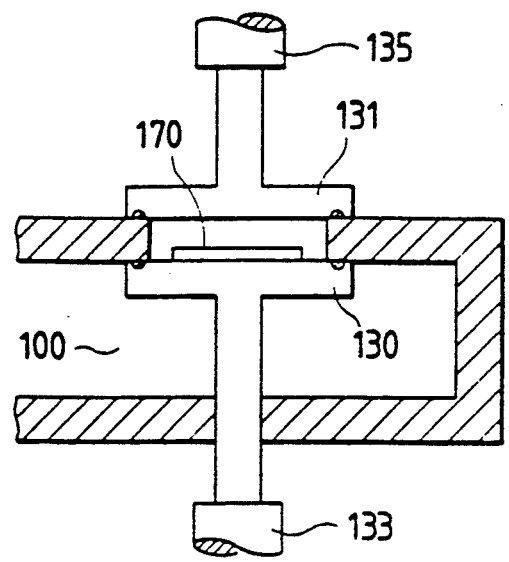
Figure 4E:
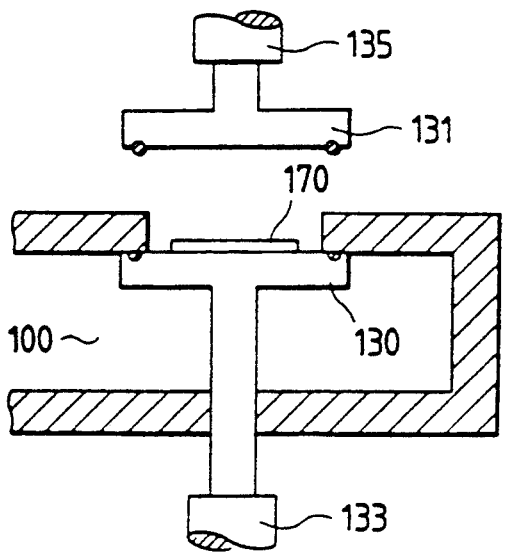
Figure 4F:
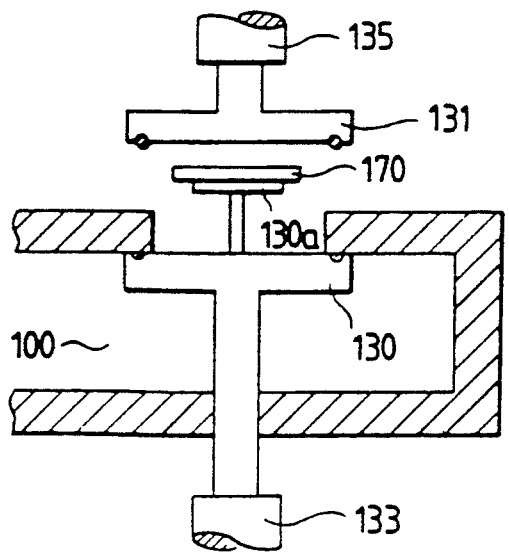

After receiving the post-processed sample 170, the sample delivery member 130a of the sample table 130 is moved down. Accordingly, the post-processed sample 170 is delivered from the sample delivery member 130a of the sample table 130 to the sample table 130 and placed on its sample disposition surface (FIG. 4C). The sample table 130 having the post-processed sample 170 is moved up so that the opening 101d is close air-tight by the sample table 130 (FIG. 4D). The cover member 131 is moved up under this state. The rise of the cover member 131 is stopped when it reaches the position (FIG. 4E) at which the rise of the sample delivery member 130a of the sample table 130 is not prevented, and, moreover, the sample scooping member 62 of the arm 61 is not prevented from reaching the position where it can receive the post-processed sample 170 from the sample delivery member 130a of the sample table 130. Under this state, the sample delivery member 130a of the sample table 130 is first moved up. Accordingly, the post-processed sample 170 is delivered from the sample table 130 to its sample delivery member 130a (FIG. 4F)

Figure 4G:
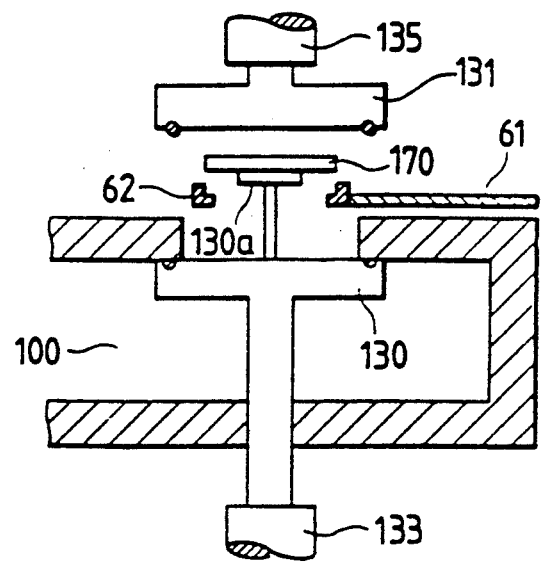

Next, when the arm 61 is rotated in the direction of the sample table 130, the sample scooping member 62 is rotated in the direction of the sample table 130. This rotation of the sample scooping member 62 is stopped when it reaches the position where the post-processed sample 170 can be exchanged between it and the sample delivery member 130a of the sample table 130, or, in other words, the position which corresponds to the back of the post-processed sample 170 held by the sample delivery member 130a of the sample table 130 (FIG. 4G). The sample delivery member 130a of the sample table 130 is then moved down so that the post-processed sample 170 is delivered from the sample delivery member 130a of the sample table 130 to the sample scooping member 62. After receiving the post-processed sample 170, the sample scooping member 62 is rotated towards the sample table 32 inside the wet-processing chamber 31 when the arm 61 is rotated in the direction of the wet-processing chamber 31.

After delivering the post-processed sample 170 to the sample scooping member 62, the sample delivery member 130a of the sample table 130 is further moved down to the position which is below the sample disposition surface of the sample table 130. The cover member 131 is thereafter moved down and the opening 101d is closed air-tight by the cover member 131. The sample table 130 is again moved down under this state and the next post-processed sample is delivered to and placed on this sample table 130.

The rotation of the sample scooping member 62 having the post-processed sample 170 is stopped when it reaches the position at which it can exchange the post-processed sample 170 between it and the sample delivery member of the sample table 32. The sample delivery member of the sample table 32 is moved up under this state. Accordingly, the post-processed sample 170 is delivered from the sample scooping member 62 to the sample delivery member of the sample table 32. After delivering the post-processed sample 170, the sample scooping member 62 is moved outside the wet-processing chamber 31 in order to prepare for acceptance of the next post-processed sample. The opening 34 is then closed.

The sample delivery member of the sample table 32 is moved down after receiving the post-processed sample 170. Accordingly, the post-processed sample 170 is delivered from the sample delivery member of the sample table 32 to the sample table 32 and is placed on its sample disposition surface. The processing solution is then supplied at a predetermined flow rate from the processing solution feed apparatus to the processed surface of the post-processed sample 170 placed on the sample table 32 through the processing solution feed pipe. At the same time, the post-processed sample 170 is rotated by the operation of the motor. In this manner, wet-processing of the post-processed sample 170 is executed.

Nitrogen gas, for example, is introduced into the wet-processing chamber 31 by the inert gas introduction means so that wet-processing is carried out in a nitrogen gas atmosphere. The waste liquor generated by this wet-processing is discharged outside the wet-processing chamber 31 through the waste liquor discharge pipe.

After such a wet-processing is complete, the supply of the processing solution, the rotation of the sample 170, and the like, are stopped, and the sample delivery member of the sample table 32 is moved up. During this rise, the wet-processed sample 170 is delivered from the sample table 32 to its sample delivery member. The rise of the sample delivery member receiving the wet-processed sample 170 is stopped at the position where this sample 170 can be exchanged between the sample delivery member and the sample scooping member 72. The sample scooping member 72 is moved under this state towards the sample table 32. This movement is stopped when the sample scooping member 72 reaches the position where the wet-processed sample 170 can be exchanged between the sample scooping member 72 and the sample delivery member of the sample table 32. The sample delivery member of the sample table 32 is then moved down. Accordingly, the wet-processed sample 170 is delivered to the sample scooping member 72. After the wet-processed sample 170 is removed, the sample delivery member of the sample table 32 prepares for the acceptance of the next post-processed sample.

The sample scooping member 72 having the wet-processed sample 170 is further moved to the dry-processing chamber 41 from the wet-processing chamber 31, passing through the opening towards the sample table 42 through the arm 71. This movement is stopped when the sample scooping member 72 reaches the position at which the wet-processed sample 170 can be exchanged between the sample scooping member 72 and the sample delivery member of the sample table 42. The sample delivery member of the sample table 42 is then moved up. Accordingly, the wet-processed sample 170 is delivered to the sample delivery member of the sample table 42. After the wet-processed sample 170 is removed, the sample scooping member 72 is once moved back and the sample delivery member of the sample table 42 is moved down. Accordingly, the wet-processed sample 170 is delivered from the sample delivery member of the sample table 42 to the sample table 42 and is placed on its sample disposition surface.

The sample table 42 is heated externally by supply of power to the heater 43 and the wet-processed sample 170 is heated through the sample table 42. The temperature of the wet-processed sample 170 is controlled to a predetermined temperature by adjusting the feed quantity to the heater 43. Thus the wet-processed sample 170 is dry-processed. Nitrogen gas, for example, is introduced into the dry-processing chamber 41 by the inert gas introduction means and dry-processing is carried out in the nitrogen gas atmosphere.

After dry-processing is thus complete, the sample delivery member of the sample table 42 is moved up. During this rise, the dry-processed sample 170 is delivered from the sample table 42 to its sample delivery member. The rise of the sample delivery member of the sample table 42 receiving the dry-processed sample 170 is stopped when the dry-processed sample 170 can be exchanged between it and the sample scooping member 72. Under this state, the sample scooping member 72 is again moved towards the sample table 42 through the arm 71. This movement is stopped when the sample scooping member 72 reaches the position at which the dry-processed sample 170 can be delivered between the sample scooping member 72 and the sample delivery member of the sample table 42. The sample delivery member of the sample table 42 is then moved down. Accordingly, the dry-processed sample is transferred to the sample scooping member 72. The sample delivery member of the sample table 42 from which the dry-processed sample 170 is removed prepares for acceptance of the next wet-processed sample.

The sample scooping member 72 having the dry-processed sample 170 is further moved from the dry-processing chamber 41 to the sample recovery chamber 150 through the opening towards the cassette table 151 through the arm 71. This movement is stopped when the sample scooping member 72 reaches the position where the dry-processed sample 170 can be delivered between it and the cassette 161 placed on the cassette table 151.

The cassette 161 has a plurality of storage grooves in the direction of height, for example, and is positioned so that the uppermost groove can accept and store the sample. The cassette 161 is intermittently moved down by a predetermined distance under this stage. Accordingly, the dry-processed sample is supported by the uppermost groove of the cassette 161 and is recovered and stored therein.

Nitrogen gas, for example, is introduced into the sample recovery chamber 150 by the inert gas introduction means so that the dry-processed sample 170 is stored in a nitrogen gas atmosphere and is once preserved in the sample recovery chamber 150. Recovery of the dry-processed samples into the cassette 161 is sequentially conducted; and after this recovery is complete, the cassette 161 is discharged outside the sample recovery chamber 150. The sample thus taken out from the sample recovery chamber 150 while stored in the cassette 161 is transferred to the next step.

Figure 6:
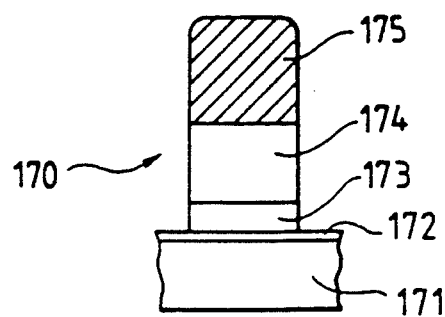
FIG. 6 is a sectional view showing an example of a sample.

The following sample is prepared several times. First, a 3,000 Å-thick silicon dioxide film 172 is formed on a Si substrate 171 such as shown in FIG. 6, a laminate wiring of a TiW layer 173 and an Al-Cu-Si film 174 is formed on the former and a photoresist 175 is used as a mask. This sample is processed by use of the apparatus shown in FIGS. 2, 3, 4A–4G and 5A and 5B.

The etching conditions are $BCl_3 + Cl_2$ as the processing gas, with a flow rate of the processing gas of 150 sccm (standard $cm^3$ per minute), a processing pressure of 16 mtorr, a microwave output of 600 W and a radio frequency bias of 60 W.

The samples which are passed through all the subsequent steps without any processing after etching are referred to as (A), those which are etched, plasma post-processed but are not passed through the wet- and dry-processings are referred to as (B), those which are subjected to the predetermined processings at all the steps are referred to as (D) and those which are not plasma post-processed after etching but are wet- and dry-processed are referred to as (C). The corrosion-proofing effects of these samples are then compared.

The processing conditions in the plasma post-processing chamber are $O_2+CF_4$ as the processing gas, with a flow rate of the processing gas of 400 sccm ($O_2$) and 35 sccm ($CF_4$) and a processing pressure of 1.5 Torr, and the plasma is generated by use of a 2.45 GHz microwave. In this case, the plasma post-processing is mainly intended to ash (remove) the photoresist and to remove chlorides remaining on the protective film on the pattern sidewall and the pattern bottom portion, and ashing is conducted for about 30 seconds and additional processing under the same condition is conducted for about one minute. In wet-processing, spinning water wash treatment with pure water is conducted for one minute and spinning drying is conducted for 30 seconds. Furthermore, the sample table is heated to 150° C. in the nitrogen gas atmosphere and the wet-processed sample is left standing for the minute for dry-processing.

Figure 7:
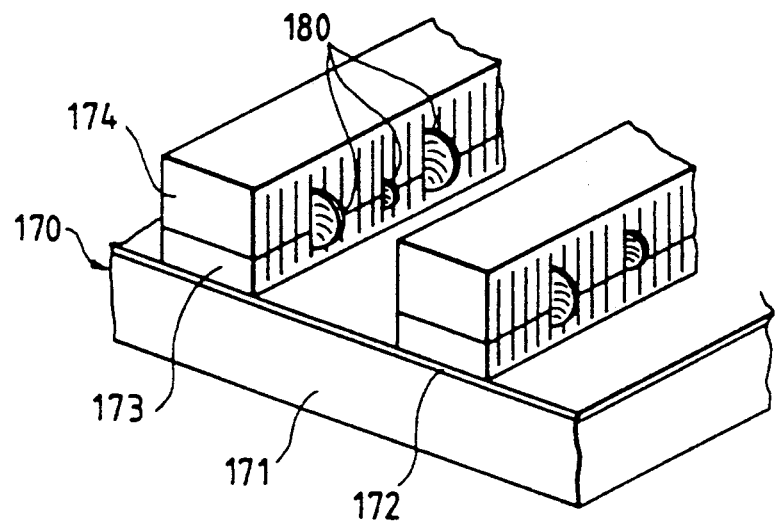
FIG. 7 is a perspective view showing an example of occurrence of corrosion.

When those samples (B) which are etched and then plasma post-processed but are not passed through the wet-processing, that is, water washing treatment and dry-processing, are observed through an optical microscope, spot-like matters analogous to corrosion can be observed within about one hour. Accordingly, they are observed in further detail by SEM. Fan-like corrosion products 180 starting from the boundary between the TiW layer and the Al-Cu-Si layer are observed as shown in FIG. 7. Even though the mixing ratio of $CF_4$ with respect to $O_2$ is changed to from 5 to 20%, the processing pressure is changed to from 0.6 to 2 Torr and the sample temperature is raised to 250° C., corrosion analogous to that described above is observed within a few hours in each case.

It is therefore believed that particularly in a laminate layer wiring, or alloy wiring, containing different kinds of metals having mutually different ionization potentials, corrosion is generated and accelerated by so-called electrolytic corrosion due to battery operation.

To sufficiently prevent the occurrence of such corrosion, it has been found that plasma post-processing alone after etching is not sufficient and even limited amounts of chlorine components must be removed completely.

As described above, therefore, processing was carried out under various conditions to examine the time till the occurrence of corrosion after processing. The result is shown in FIG. 8.

Figure 8:
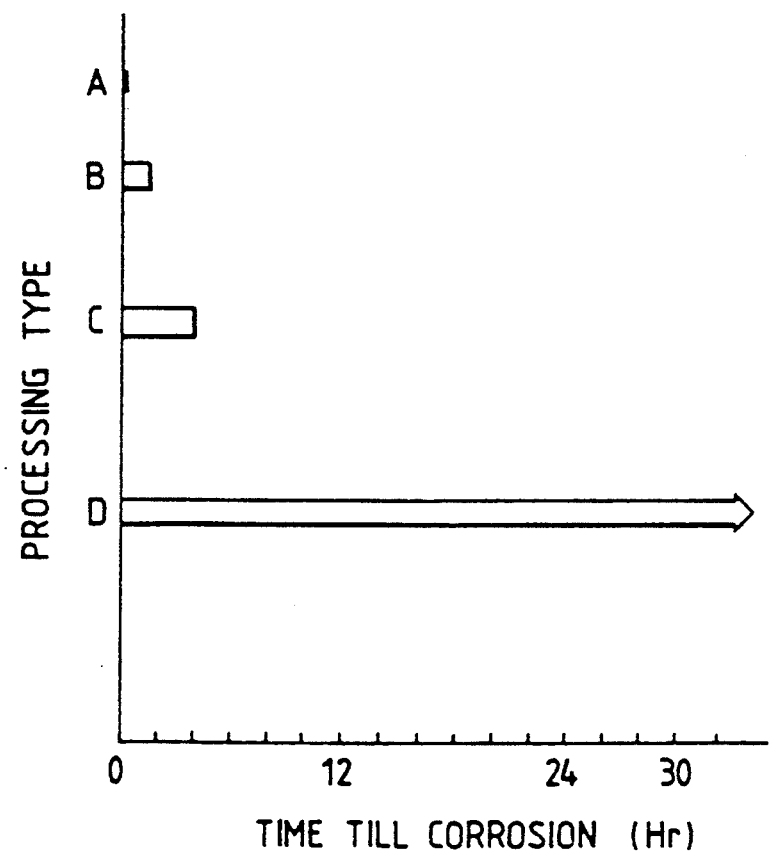
FIG. 8 is a diagram showing the relation between processing modes after etching and the time till occurrence of corrosion.

As can be seen from FIG. 8, in the case of wiring materials such as the laminate layer wiring in which corrosion is vigorous, the plasma post-processing such as resist ashing after etching, or water washing processing and drying processing after etching without carrying out plasma post-processing, cannot provide a sufficient corrosion-proofing effect. A high corrosion-proofing effect for more than 30 hours can only be obtained by carrying out in series the etch-processing, the plasma post-processing such as ashing of the resist, the water washing processing and the dry-processing.

Besides the washing process described above, the same effect of inhibition of corrosion can be obtained by passivation processing with a mixture of nitric acid and hydrogen fluoride or nitric acid, which also serves to remove any residues after plasma etching, before the water washing processing.

In order to remove the reactive products on the pattern sidewall that cannot be removed sufficiently by the plasma post-processing, it is advisable to conduct liquid processing by use of a weakly alkaline solution or a weakly acidic solution (e.g. acetic acid) after plasma post-processing subsequent to etching and then to carry out the water washing processing and dry-processing. In this manner, the chlorine components can be remove more completely and the corrosion-proofing effect can be further improved.

In the embodiment described above, the time till completion of the wet-processing of the plasma post-processed sample is limited to about one hour because corrosion occurs within about one hour as shown in FIG. 8 in the case of the sample shown in FIG. 6. However, wet-processing is preferably completed as quickly as possible. In other words, the plasma post-processed sample is preferably transferred immediately after completion of plasma post-processing from the plasma post-processing apparatus to the wet-processing apparatus. Though the plasma post-processed sample is transferred inside the atmosphere in the embodiment described above, it may be transferred in a vacuum or in an inert gas atmosphere. Transfer in such an atmosphere is extremely effective when the time from plasma post-processing till the start of wet-processing is longer than the corrosion occurrence time in the atmosphere, for example. In such a case, means may be disposed between the plasma post-processing apparatus and wet-processing apparatus for preserving the plasma post-processed sample in a vacuum or in the inert gas atmosphere.

Figure 9:
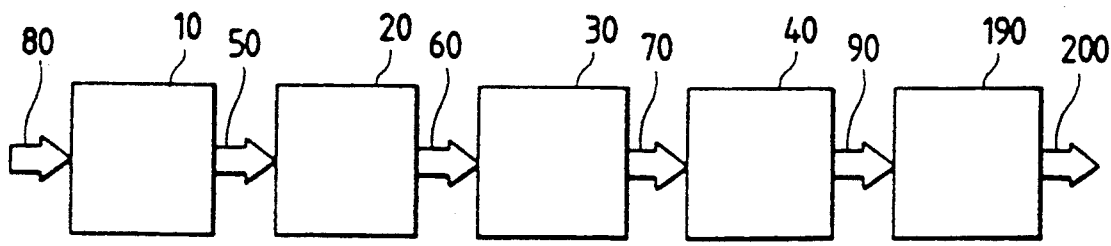
FIG. 9 is a block diagram of a second sample processing apparatus.

FIG. 9 explains a second embodiment. The difference of this embodiment from the first embodiment shown in FIG. 1 lies in that a passivation-processing apparatus 190 is additionally disposed on the downstream side of the dry-processing apparatus 40. In this case, the sample transfer means 90 has the function of transferring the dry-processed sample from the dry-processing chamber (not shown) of the dry-processing apparatus to a passivation-processing chamber (not shown) of the passivation-processing apparatus 190. Additionally, sample transfer means 200 for transferring the passivated sample to a recovery cassette (not shown), for example, is disposed. Like reference numerals are used to identify like constituents as in FIG. 1 and their explanation will be omitted.

In FIG. 9, the etched, plasma post-processed sample (not shown) is transferred into the wet-processing chamber (not shown) of the wet-processing apparatus 30 by the sample transfer means 60 and is placed on the sample disposition surface of the sample table (not shown) as the wet-processing station inside the wet-processing chamber. The plasma post-processed sample placed on the sample table in the wet-processing chamber is subjected to development solution processing. Residues, and the reactive products on the pattern sidewall, after etching are completely removed by such wet-processing. If the sample contains Al as its component, Al, too, is partly dissolved. When such a sample is dry-processed and taken out into the atmosphere, for example, oxidation as a form of corrosion will occur disadvantageously. Therefore, the sample subjected to development and dry-processing in the dry-processing chamber of the dry-processing apparatus 40 is transferred into the passivation-processing chamber of the passivation-processing apparatus 190 and is placed on a sample disposition surface of the sample table (not shown) at the processing station in the passivation-processing apparatus 190. Gas plasma for passivation-processing, or oxygen gas plasma in this case, is generated in or introduced into the passivation-processing chamber. Ozone may be used instead of oxygen. The dry-processed sample placed on the sample table in the passivation-processing chamber is passivation-processed by the oxygen gas plasma. The passivation-processed sample is transferred from the passivation-processing chamber to the recovery cassette by the sample transfer means and recovered and stored therein.

Passivation-processing may use nitric acid, besides the chemicals described above.

Since the present invention can sufficiently remove the corrosive materials generated by etching of the sample, it provides the effect that corrosion of the sample after etching can be prevented sufficiently irrespective of the type of sample.

As described previously, according to the present invention the wet-processing apparatus 30 (see FIG. 1) has plural sample tables, and each of them can carry out parallel processing or series processing (wet-processing) of the samples. A supply means for chemical liquid used for the wet-processing has introduction nozzles, which are classified for acid, alkali and pure water processing liquids, and each chemical liquid is controlled to have a temperature from, e.g., room temperature to 100° C. The processing waste liquid is changed by the acid processing, the alkaline processing and the water processing. Since all operations in this system are controllable by a controller comprising a personal computer provided in this system, the processing sequence, in other words, the flow rate, the flow rate of the chemical liquid, the rotation amount of the spinner and parallel or series processing, etc. can be programmed freely.

Figure 10:
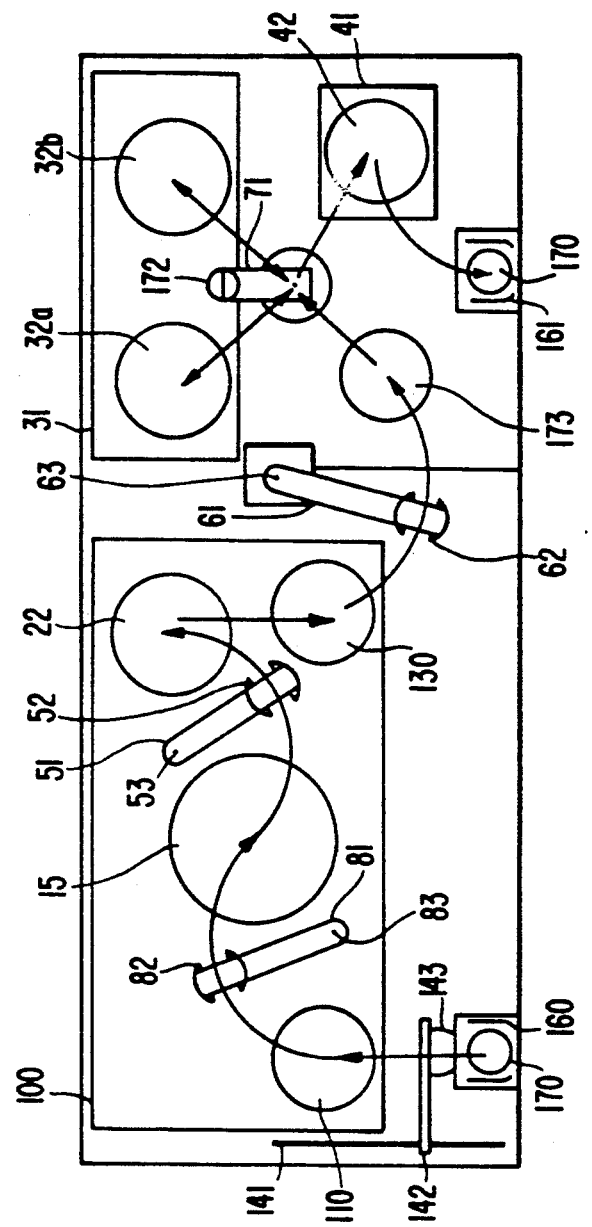
FIGS. 10 and 11 show, respectively, a diagrammatic plan view of apparatus having a plurality of wet-processing means, and a diagrammatic longitudinal side view of the apparatus shown in FIG. 10.
Figure 11:
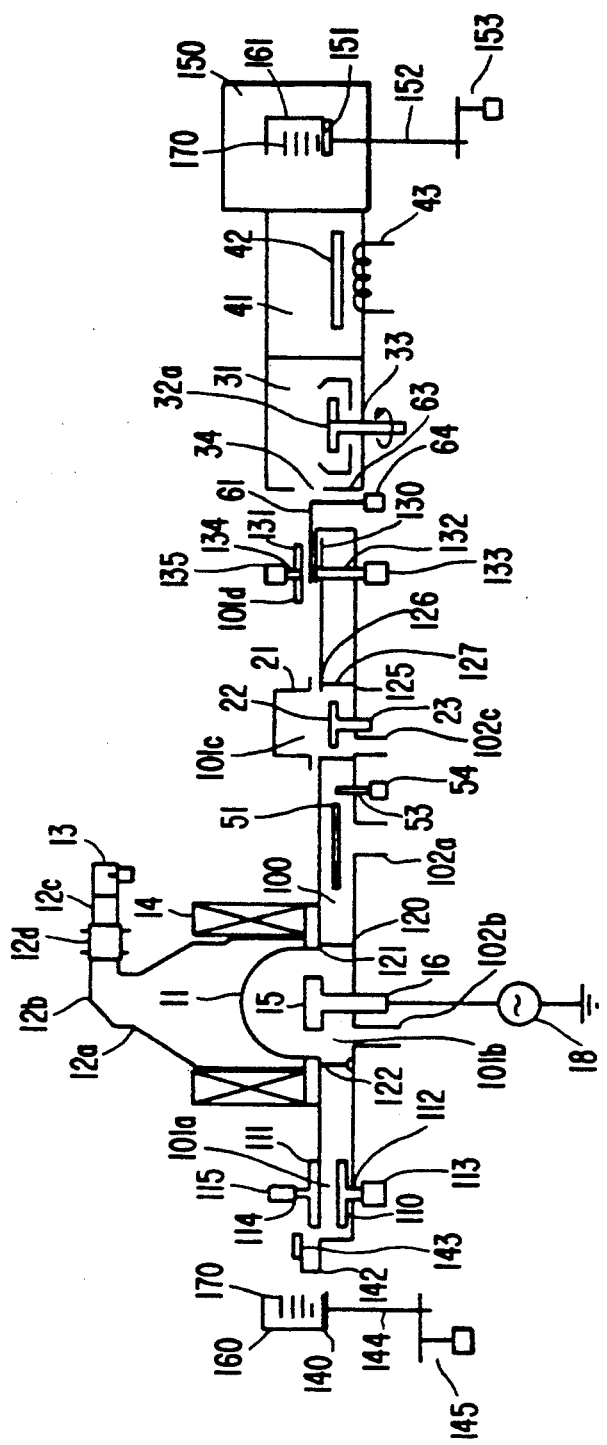

Reference is made to FIGS. 10 and 11, showing this aspect of the present invention having a plurality of wet-processing means (e.g., two-wet processing stations respectively having sample tables 32a and 32b). Reference characters in FIGS. 10 and 11, which are the same as in previously discussed drawing figures in the present application (e.g., FIGS. 2 and 3), represent structure having effectively the same function as previously discussed, and will not be further described except with respect to any differences with the previously discussed structure. Each of sample tables 32a and 32b has a sample installation surface on the respective surface. Each of the sample tables 32a and 32b is provided extending in a substantially horizontal direction, on an upper end of a respective support shaft 33, the respective sample installation surface forming the upper surface of the sample table. The sample installation surface of the respective sample tables 32a and 32b is positioned at a lower portion than the sample scooping member 62 of the arm 61. Each of the sample tables 32a and 32b provides a sample receiving member (not shown in FIGS. 10 and 11), respectively. Note that in FIG. 10, the wet processing room 31 contains the two (2) sample tables 32a and 32b. After treatment on the sample table 130 of the plasma post-processing apparatus, the sample is transferred, e.g., by sample scooping member 62 of the arm 61, to support member 173, by transfer techniques as discussed previously. From support member 173, transfer arm 172 can be used to transfer the sample to sample table 32a or to 32b, depending on availability for the wet processing and whether series or parallel processing is to be carried out.

If series processing is to be performed, the sample is transferred first, e.g., to sample table 32a from support member 173, and thereafter is transferred (after wet-processing on sample table 32a) to sample table 32b for wet-processing on sample table 32b. Thereafter, the sample is transferred to sample table 42 of the dry-processing chamber 41, for processing therein as discussed previously. Of course, treatment with different liquids can be performed at each of sample table 32a and sample table 32b, respectively.

If parallel processing is to be performed, a sample can (alternatively) be transferred from support member 173 to either sample table 32a or sample table 32b by transfer arm 172, depending, e.g., on availability of the sample table. After, e.g., treatment with a plurality of different treatment liquids at the respective sample table 32a or 32b, the sample can be transferred by transfer arm 172 to sample table 42 of the dry-processing chamber 41.

Figure 15:
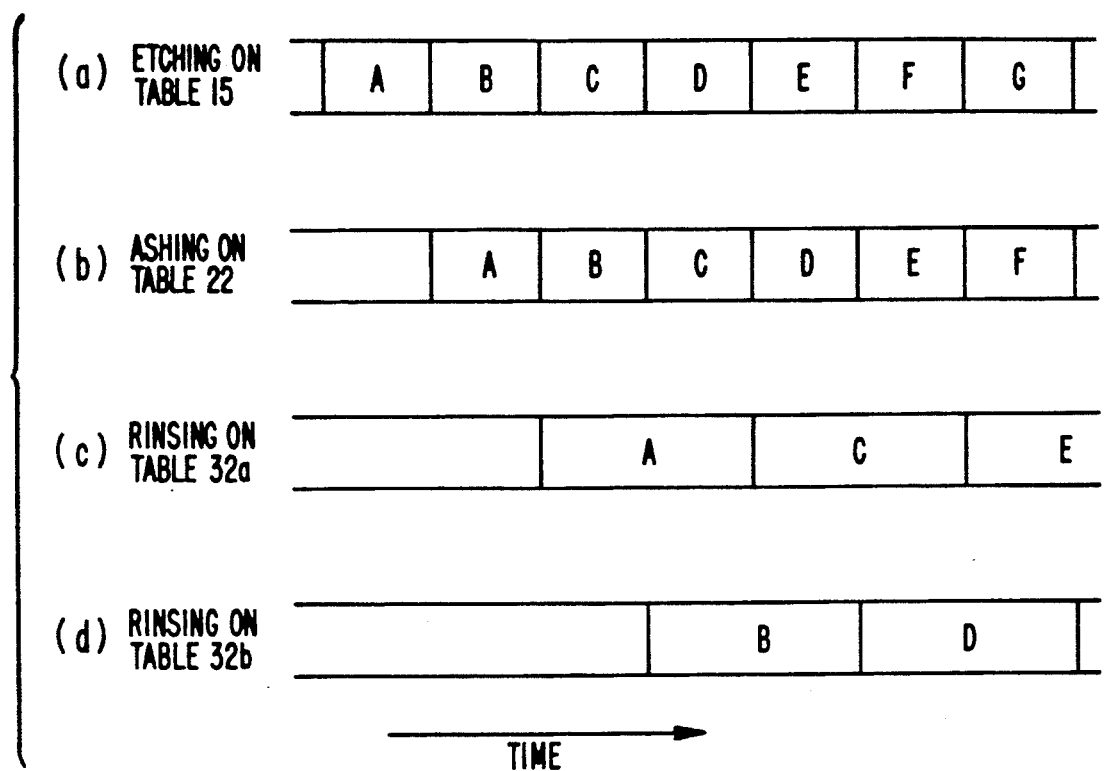
FIG. 15 schematically shows a processing sequence for parallel processing of samples, over a period of time, in a plurality of wet processing means (stations)

Next will be described a parallel wet-processing particularly useful where the wet-processing takes a longer amount of time than, e.g., a time period required for treatment in buffer chamber 100. This parallel wet-processing will be discussed in connection with FIG. 15. Parallel wet-processing is particularly effective to improve the through output when the period required for the wet-processing is much longer than the period required for other (prior) processes, such as processes in the buffer chamber 100. In order to simplify the explanation of parallel wet-processing, it is assumed that the periods for etching process on the table 15 and ashing process on the table 22 are 120 seconds, that the period for wet-processing on the table 32a or 32b is 240 seconds, and that any periods for transfer of the sample from one location to another location are neglected. Samples A, B, C, . . . are sequentially etched on the table 15 every 120 seconds and transferred to table 22 to be ashed there every 120 seconds, as shown in FIGS. 15(a) and 15(b). Etched and ashed sample A is transferred to the table 32a and rinsed there for 240 seconds. Though ashing for sample B is ended at the half-time point of the period during which sample A is rinsed, the ashed sample B would have to wait to be wet-processed on the table 32a till the wet-processing for Sample A on the table 32a is finished. However, another table 32b is available to wet-process sample B, without the waiting time, since wet-processing for a previous sample on the table 32b has finished by the end of the period for ashing sample B, that is, the half time point of the period for wet-processing sample A. Samples A, B, C, . . . are alternately transferred to tables 32a and 32b with a half time shift of the wet-processing period as shown in FIGS. 15(c) and 15(d).

The wet-processing for each sample requires 240 seconds which is twice 120 seconds required for the etching or ashing process. Since the rough output of the over-all system is determined by the longest period in the sequential processing, the through output of the system with one wet-processing table is determined by 240 seconds. However, with parallel wet-processing, wet-processing for each sample can be finished every 120 seconds. Since the longest period which determines the through output of the system is shortened by half, the through output is improved.

As seen in the foregoing, sample waiting time, for the wet-processing, can be reduced. Accordingly, through use of the presently disclosed parallel treating the total time, from beginning to end, of processing a sample can be reduced.

Next, a sample processing method using the above sample processing apparatus will be explained. As the sample 170, a 3000 Å-thick silicon dioxide film 172 is formed on a silicon substrate as shown in FIG. 6; on the former a laminated wiring of a TiW layer 173 and an Al-Cu-Si film 174 are formed, and the sample 170 uses a photoresist 175 as a mask.

As the etching processing conditions, the selected conditions are $BCl_3+Cl_2$ as the etching processing gas, a flow rate of the processing gas of 150 sccm, a processing pressure of 16 mTorr, a microwave output of 600 W and RF bias of 60 W.

The samples which are passed through all the subsequent steps without any processing after the etching processing are referred to as (A), those which are plasma post-processed after the etching processing but are not passed through the wet-processing and the dry-processing are referred to as (B), those which are subjected to the predetermined processings at all the steps are referred to as (D), and those which are not plasma post-processed after the etching processing but are wet-processed and dry-processed are referred to as (C). The corrosion-proofing effects of these samples are then compared.

Besides, the processing conditions in the plasma post-processing chamber are $O_2+CF_4$ as the processing gas, a flow rate of the processing gas of 400 sccm ($O_2$) and 35 sccm ($CF_4$) and a processing pressure of 1.5 Torr, and the plasma is generated by use of a 2.45 GHz microwave.

In this case, the plasma post-processing is mainly directed to ashing the photoresist and to remove chlorides remaining on the protective film on the pattern side wall and the pattern bottom portion, and the ashing processing is conducted for about 30 seconds and the additional processing under the same plasma condition is conducted for about one minute.

Further, in the wet-processing, a spinning water wash treatment with pure water is conducted for one minute and the spinning drying is conducted for 30 seconds. Furthermore, the sample table is heated to 150° C. by the heater under the nitrogen gas atmosphere and the wet-processing sample is left standing on it for one minute for the dry-processing.

As a result, when those samples which are etching-processed and then plasma post-processed but are not passed through the wet-processing, that is, the water washing treatment and the dry-processing, are observed through an optical microscope, spot-like matters analogous to the corrosion can be observed within about one hour.

Accordingly, they are observed in further detail by SEM. As a result, fan-like corrosion products 180 starting from the boundary between the TiW layer and Al-Cu-Si layer are observed, as shown in FIG. 7.

Therefore, even though the mixing ratio of $CF_4$ with respect to $O_2$ is changed from 5-20%, the processing pressure is changed from 0.6-2 Torr and the sample temperature is raised to 250° C., corrosion analogous to the one described above is observed within a few hours after the processings in either case.

The corrosion such as described above cannot be observed in an Al-Cu-Si single layer wiring film. It is therefore believed that in the laminated layer wiring of different kinds of metals having mutually different ionization tendencies, the corrosion is generated and accelerated by so-called electrolytic corrosion due to a battery operation.

To sufficiently prevent the occurrence of such corrosion, it has been found that the plasma post-processing alone after the etching processing is not sufficient and even limited amounts of the chlorine components must be removed completely.

As described above, therefore, the processings were carried out under various conditions to examine the time till the occurrence of the corrosion after the processing, and the result shown in FIG. 8 was obtained.

As can be seen from FIG. 8, in the case of the wiring materials such as the laminated layer wiring in which corrosion is vigorous, the plasma post-processing such as a resist ashing after the etching processing, or the water washing processing and the drying processing after the etching processing without carrying out the plasma post-processing, cannot provide a sufficient corrosion-proofing effect.

A high corrosion-proofing effect for more than 30 hours can first be obtained by carrying out in series the etching processing, the plasma post-processing such as the ashing of resist, the water washing processing and the dry-processing.

Further, besides the processing described above, a same effect can be obtained by processing with a mixture of nitric acid and hydrofluoric acid, which also serves to remove any residues after the etching, before the water washing processing.

In order to remove the protective film on the pattern side wall that cannot be removed sufficiently by the plasma post-processing, it is advisable to process the sample by wet-processing using a weakly alkaline solution or a weakly acidic solution (for example, acetic acid), after the plasma post-processing subsequent to etching, and then to carry out the water washing processing and the dry-processing. In this manner, the chlorine components can be removed more completely and the corrosion-proofing effect can be further improved.

Figure 12:
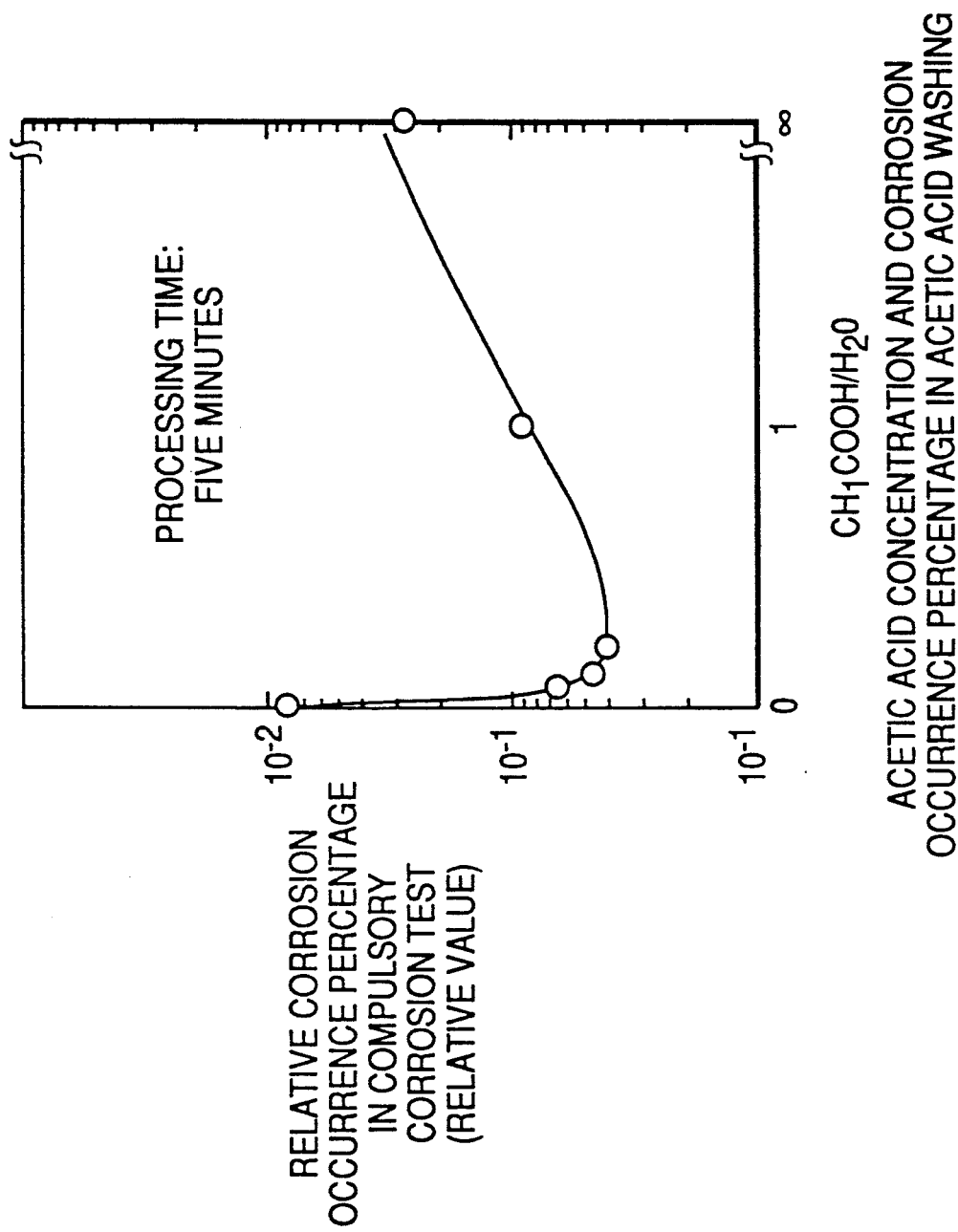
FIG. 12 shows a relationship between corrosion occurrence and acetic acid concentration when the wet processing includes an acetic acid treatment.

In FIG. 12, a relative relation between the acetic acid concentration, and the corrosion occurrence percentage, when wet-processing is conducted using acetic acid, is shown. As can be seen from FIG. 12, when the acetic acid concentration is 10–20%, the corrosion occurrence percentage is a minimum value.

Figure 13:
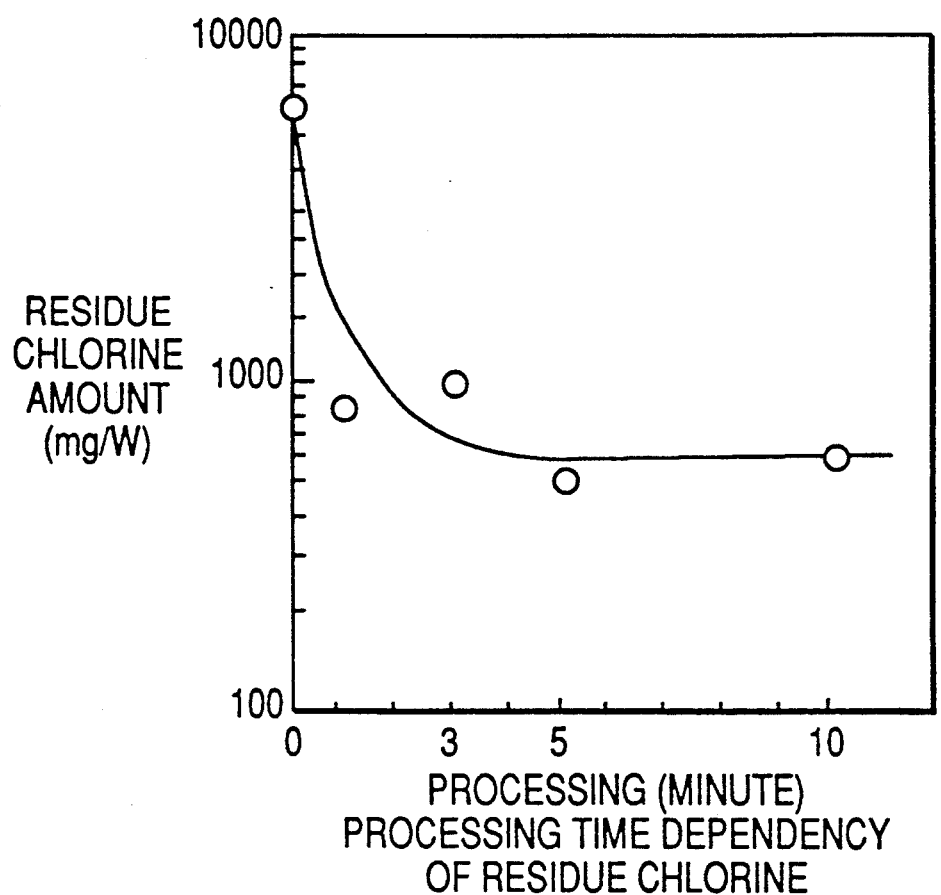
FIG. 13 shows a relationship between processing time and residual chlorine content on the surface of the sample.

Further, in FIG. 13, a relation between processing time and the residue chlorine amounts on the sample surface is shown. As can be seen from FIG. 13, the residue chlorine amount lowers gradually up to 4 minutes from the start of the processing, after which it becomes constant. Accordingly, it can be seen that desirably the processing time (for wet-processing) is more than four minutes.

However, since the total time for both etching processing and ashing processing is one to two minutes, and since four minutes are long remarkably, waiting time for the wet-processing is long where only a single wet-processing station is used. According to the present invention, having a plurality of wet-processing stations and particularly where parallel processing is performed, the through-put is accelerated in this wet-processing so that lowering of the through-put can be avoided.

Moreover, according to the present invention chemical liquid processing and the water washing processing can be conducted in series and successively.

Further, in the case where acetic acid alone is used for chemical wet-processing, during the sample processing the adsorbed chlorine on the sample surface is dissolved in water; a high concentration hydrochloric acid is generated locally and Al is locally etched. Accordingly, in order to not locally etch Al, a buffer liquid comprising a weak acid (for example, acetic acid) and a weak alkali (for example, ammonia) can be used.

Figure 14:
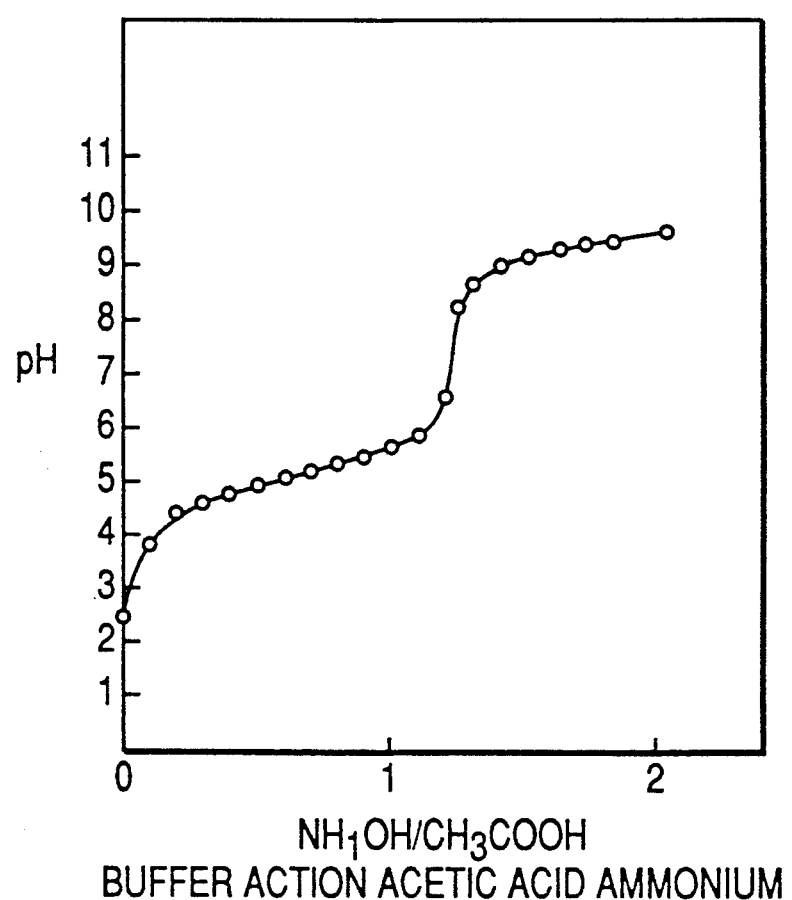
FIG. 14 shows the buffering action of a weak acid-weak alkali buffer liquid.

The buffer action of the acetic acid-ammonia buffer liquid is shown in FIG. 14. Corrosion-proofing effect is seen at every buffer concentration. However, in the alkali region Al is etched; accordingly, it is desirable to use the buffer liquid in the acid region.

Further, by increasing the wet-processing temperature, the necessary processing time shown in FIG. 13 can be shortened. At 40° C. the wet-processing requires five minutes; by making the temperature of the processing liquid 80° C. the wet-processing can be obtained effectively in about two minutes. The temperature of the processing liquid can be controlled from room temperature to 100° C., as discussed previously. Accordingly, relatively high temperature liquid wet-processing treatments can be advantageous.

Hereinafter, an embodiment according to the present invention will be explained referring to FIGS. 16-18.

Figure 16:
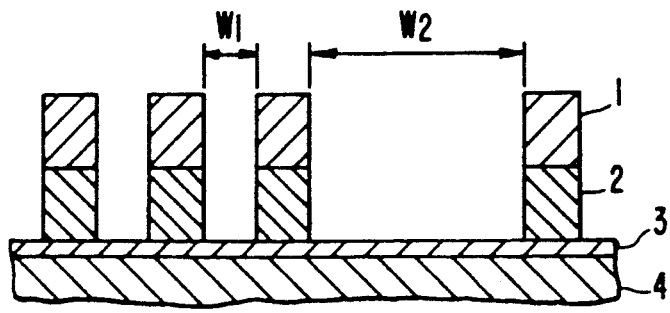
FIG. 16 is a longitudinal cross-sectional view showing one embodiment of a part of a face of a sample having been subjected to dry etching, processed by using a dry-etching method according to the present invention.

FIG. 16 is one embodiment showing a cross-sectional condition of a wafer that has been etching-processed according to the present invention. The wafer has a structure in which, on a silicon substrate 4, a base oxide film 3 (for example, a $SiO_2$ film) as an insulation film is formed. On the oxide film 3 a film composed of an aluminum system material, in this case, for example, an aluminum alloy film 2 composed of Al-Si-Cu, to be etched, is formed, and on the aluminum alloy film 2 a mask 1 which is patterned by an interval with different space sizes (note the difference in size between $W_2$ and $W_1$) is formed. FIG. 16 shows structure in which exposed portions of the aluminum alloy film 2 (shown in FIG. 16 after etching of the aluminum alloy film 2) has been subjected to etching through the mask 1.

Figure 18:
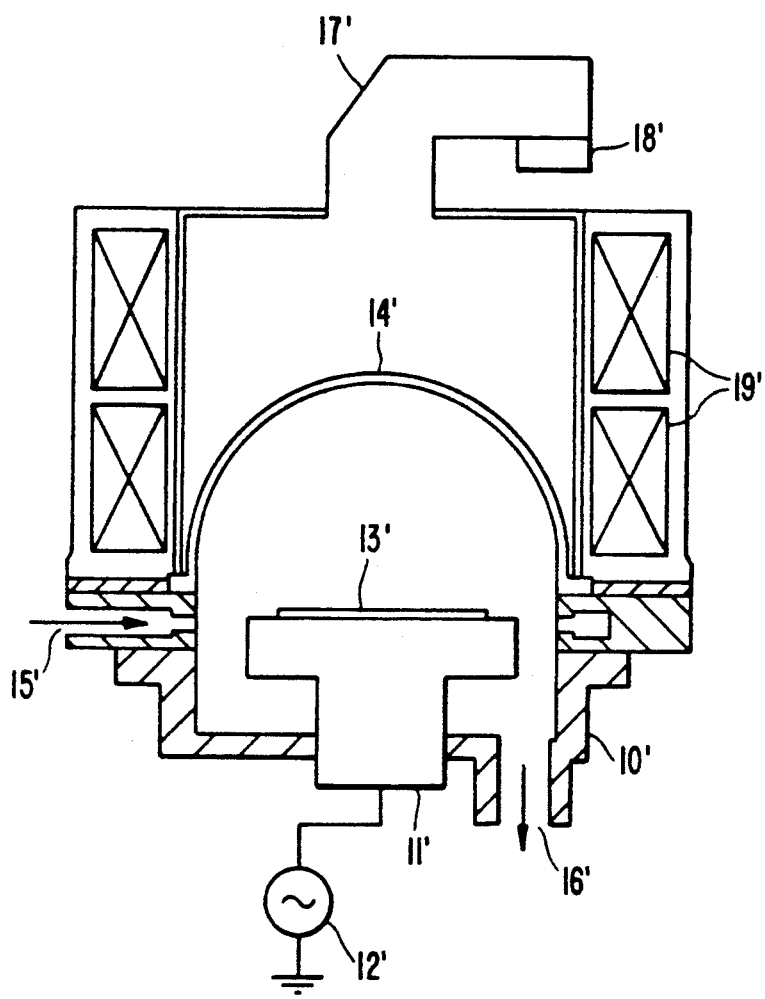
FIG. 18 is a construction view showing one example of an apparatus for performing a dry etching method according to the present invention.
Figure 19A:
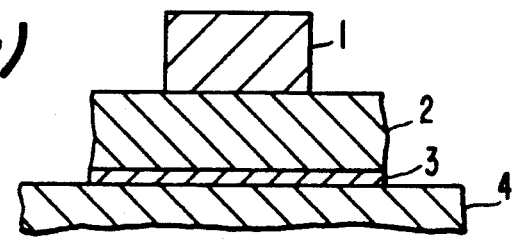
FIGS. 19(a) and 19(b) are longitudinal cross-sectional views showing a part of a sample subjected to dry etching, for explaining problems arising when dry-etching using prior art gas mixtures in the dry etching.
Figure 19B:
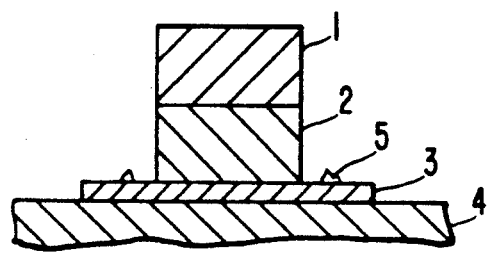
Figure 20A:
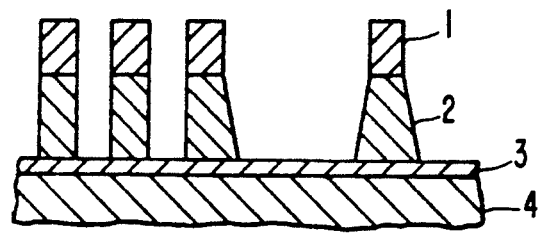
FIGS. 20(a) and (b) are longitudinal cross-sectional views showing a part of a sample subjected to dry etching, for explaining problems arising when dry-etching using prior art gas mixtures in the dry etching.
Figure 20B:
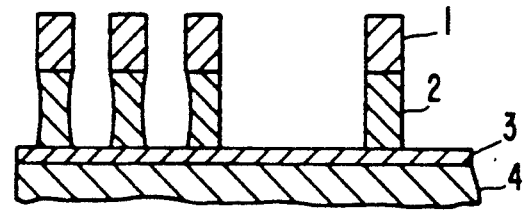

The etching processing of the wafer can be carried out in apparatus as shown in FIG. 18, using a microwave etching apparatus in which a plasma is formed from an etching gas, using an action between an electric field produced by the microwaves and a magnetic field. The apparatus shown in FIG. 18 will be briefly described. First of all, on an upper portion of a processing room 10', a discharge tube 14' made of quartz is provided, so as to form a vacuum processing room. In this processing room 10', a sample table 11' for disposing a wafer 13', as the material to be etched, is provided. On the sample table 11', a high frequency power source 12' is connected, and it can apply high frequency electric power to the sample table 11'.

In this case, a gas supply port 15' for supplying a gas into the vacuum processing room, for etching, is connected to a gas supply source (not shown in the drawing), and is provided at a side portion of the processing room 10'. An exhaust port 16' for connecting to a vacuum exhaust apparatus (not shown in the drawing) is provided on a bottom portion of the processing room 10'.

On an outer side of the exhaust port 16', a waveguide 17' for introducing microwaves is provided, and a magnetron 18' for oscillating the microwaves is provided on an end portion of waveguide 17'. Also shown is a solenoid coil 19' surrounding the discharge tube 14', for generating a magnetic field in the discharge tube 14'.

In the apparatus constructed as described above, a processing gas for etching is supplied from the gas supply port 15' into the vacuum processing room; and by evacuating gas from the exhaust port 16' the gas pressure in the vacuum processing room is reduced to a predetermined pressure condition. In this condition, microwaves are introduced from the magnetron 18' via the waveguide 17', and the magnetic field is formed in the discharge tube 14'.

Due to interaction between the electric field formed by the microwave and the magnetic field formed by the solenoid coil 19', plasma is produced from the processing gas in the discharge tube 14'. Furthermore, at this time, high frequency electric power is applied to the sample table 11' via the high frequency power source 12'. Accordingly, a bias voltage is caused, and ions in the plasma are drawn toward the wafer 13', whereby etching-processing is carried out.

Using the apparatus of FIG. 18, etching of an aluminum alloy as shown in FIG. 16 was carried out under the following conditions. Namely, the gas mixture, used for forming the plasma, was composed of $BCl_3$, $Cl_2$ and $CH_3OH$. Where a 6-inch wafer is utilized as wafer (sample) 13', the components of the gas mixture, $BCl_3$, $Cl_2$ and $CH_3OH$, were introduced respectively in amounts of 30, 70 and 10-15 SCCM, respectively; while, where the wafer 13' has a size of, e.g., 8 inches, the components of the gas mixture, $BCl_3$, $Cl_2$ and $CH_3OH$, were introduced respectively in amounts of 40, 160 and 15-25 SCCM.

Moreover, the pressure in the processing room was 5-18 mTorr, the high frequency electric power was 25-200 W, and the microwave power was 200-400 mA, the bias voltage obtained being $-40$ to $-50$ V.

Since the gas mixture composed of $BCl_3$, $Cl_2$ and $CH_3OH$ was used as the processing gas for forming the plasma, an amount of the deposition substance forming the protection film, generated during the processing, was decreased in comparison with an amount of a deposition substance formed utilizing prior art gas mixtures, so that a range of processing conditions, including the pressure, while achieving satisfactory results, can be increased; furthermore, a range for the microwave power and high frequency electric power, while achieving satisfactory results, can be widened. Thus, optimum conditions can be easily achieved.

For example, in a case where a line width (space size between film portions in the pattern) is 0.6 μm, corresponding to a 16 megabit DRAM, an etching speed for the aluminum alloy film was 500-600 nm/min, a homogeneity in the wafer was ±5%, and a selection ratio between the mask (photo-resist) and the aluminum alloy was above 3.

Furthermore, there was no difference in the sidewall shape, due to micro-loading, and a difference in speed according to micro-loading can be restricted to about 8%. As a result, even when etching materials having different space sizes of $W_1$ and $W_2$, as shown in FIG. 16, sidewall shape can be formed vertically.

Figure 17:
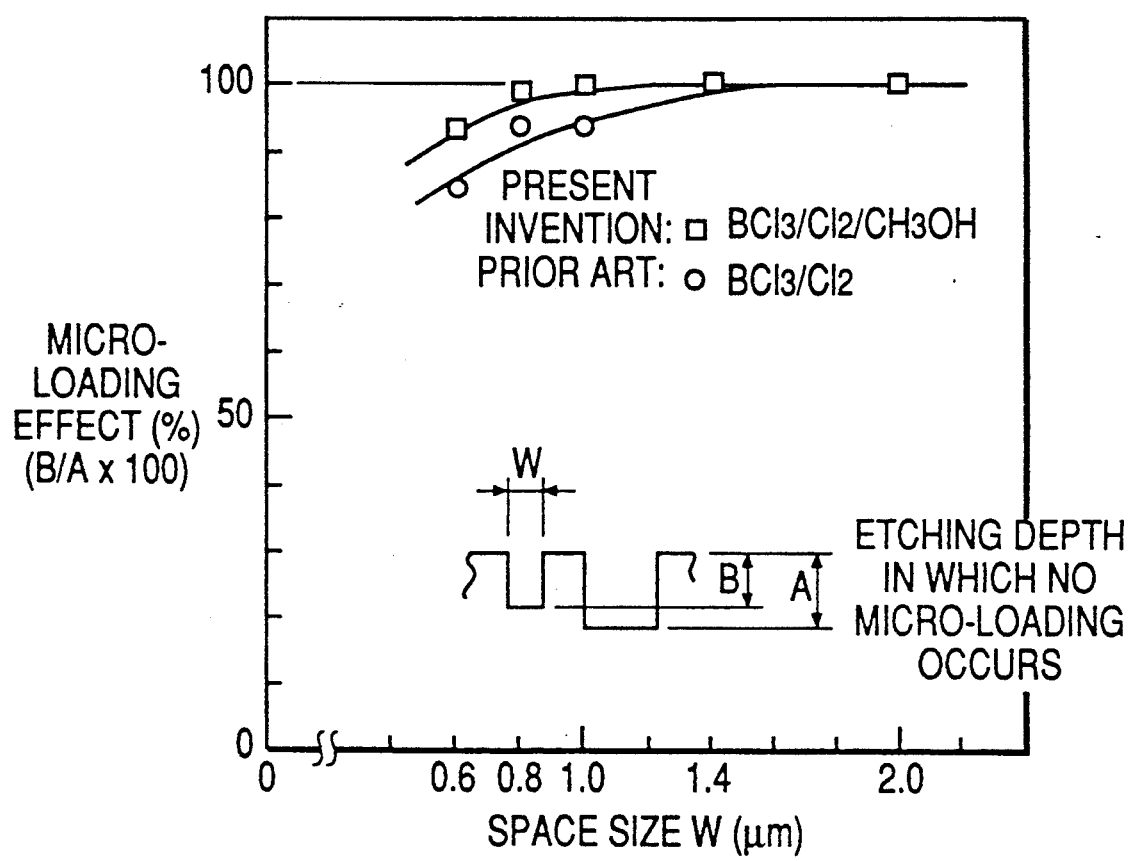
FIG. 17 is a comparative graph showing a microloading effect vs. pattern space size, of a material etched according to the present invention and of a material etched using a prior art mixture gas.

Further, as can be seen in FIG. 17, when a mixing gas composed of $BCl_3$, $Cl_2$ and $CH_3OH$ was used as the processing gas, and taking into account the difference in speed according to a micro-loading, it can be seen that satisfactory results are obtained even where a space size was less than 1.4 μm.

According to this embodiment, since the aluminum alloy is etching-processed by a halogen system gas composed of $BCl_3$ and $Cl_2$, with an aluminum alloy sidewall protection film being formed by a ROH gas of $CH_3OH$, a deposition substance acting as the sidewall protection film is formed in a satisfactory amount at the wide pattern width portion, and adheres easily to the sidewall to provide desired protection. However, since an amount of the deposition substance generated is smaller than that generated when utilizing prior art gas mixtures, a range for the optimum conditions can be widened; therefore, an aluminum film can be etching-processed with a good and accurate shape irrespective of pattern density.

Furthermore, at narrow widths between patterns (e.g., $W_1$ in FIG. 16), etchants hardly flow into the narrow widths, so that the reaction product hardly is generated, and the etching speed is low. By matching to the slow etching speed at the narrow portion of the pattern width and by adhering deposition substance at wide portions of the pattern width, a same speed ratio of etching can be achieved.

Furthermore, since the amount of deposition substance utilizing prior art gas mixtures is relatively large, a bias voltage applied to, e.g., a table on which the material to be etched is positioned must be made relatively large so as to remove the deposition substance. However, such large bias voltage damages a mask and a base under the layer to be etched. Accordingly, this invites lowering in the selection ratio. According to the present invention, since a relatively small amount of deposition substance is generated, as compared with that of the prior art, the bias voltage can be made small, whereby selection ratio can be improved.

In the foregoing embodiment, as the aluminum material system an aluminum alloy is exemplified. In addition, a same affect according to the present invention can be achieved using an aluminum film, or a multilayer film composed of an aluminum or aluminum alloy layer and a barrier metal layer (for example, TiN/Ti, W, TiW, etc.).

In the foregoing described embodiment, a gas including $BCl_3$ and $Cl_2$ is exemplified as the halogen system gas. However, the present invention is not limited thereto, and the halogen system gas can be (or include) HBr, $Br_3$, $Br_2$, $BBr_3$, etc. Further, in this embodiment, a gas composed of $CH_3OH$ is exemplified as the ROH gas. However, a gas of $C_3H_5OH$, $C_5H_7OH$, as well as other ROH gases including elements in addition to C and H for R, can be employed. Further, in the present embodiment, an action between (1) an electric field produced by microwaves and (2) a magnetic field is exemplified as a method for generating a plasma of the processing gas. However, other known methods for generating the plasma can also be utilized.

Hereinafter, another embodiment according to the present invention will be explained. In this further embodiment, a mixing gas composed of $CH_3OH$ and $Cl_2$ was used as the etching gas mixture for forming the plasma, and an apparatus as shown in FIG. 21 was used to perform the etching.

Figure 21:
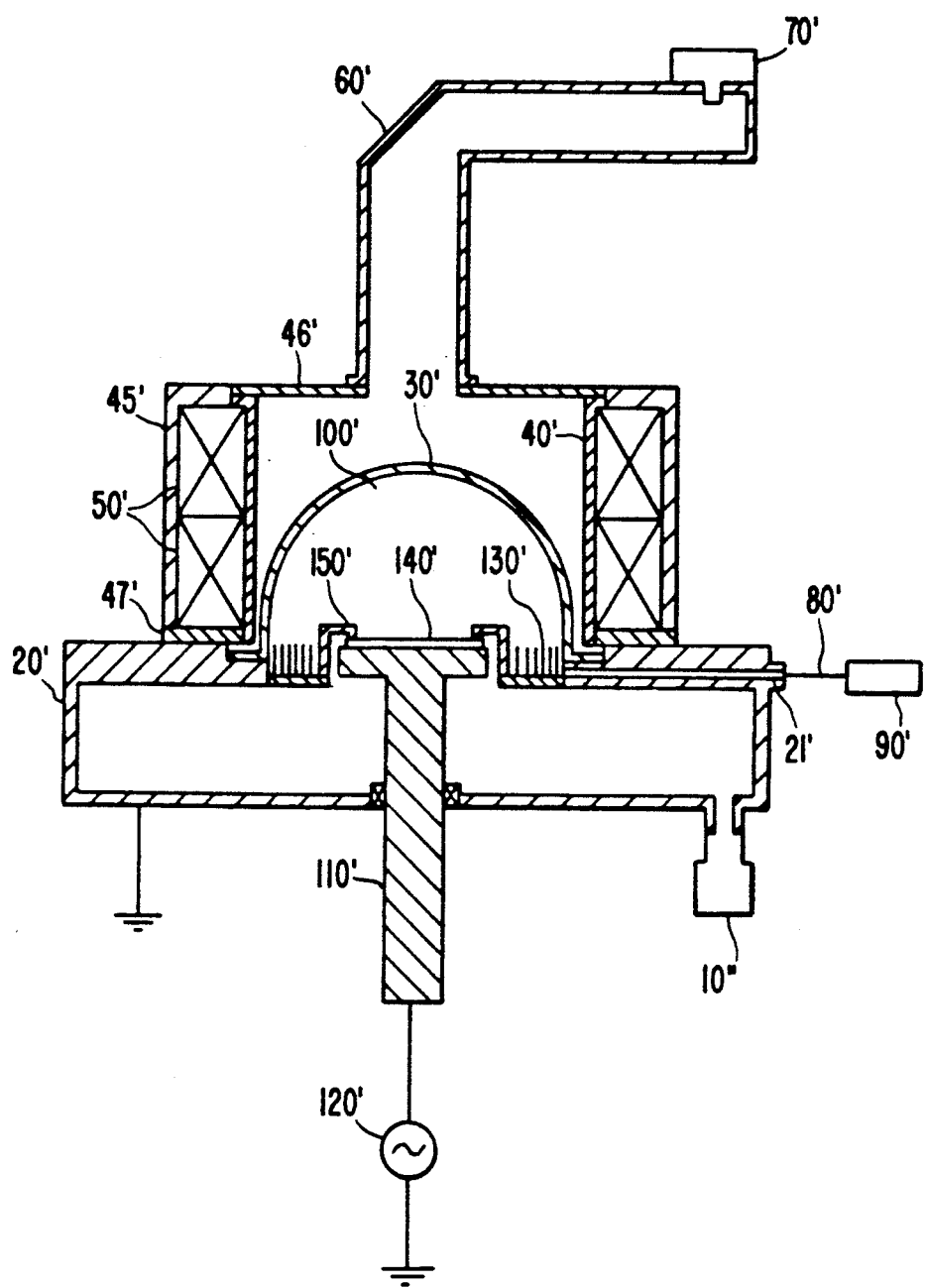
FIG. 21 is a construction view showing another example of an apparatus for performing a dry etching method according to the present invention.

Referring to FIG. 21, an etching apparatus comprises an evacuating apparatus 10'', a vacuum vessel 20' and a discharge tube 30'. The vacuum vessel 20' connects the evacuating apparatus 10'' and has an open end at an upper side. Discharge tube 30' has an open end at one end and is constituted to form an air-tight structure toward up and down directions.

At an outer side of the discharge tube 30', a waveguide tube 40' is provided, and at an outer side of the waveguide tube 40' a magnetic field generating means, such as an annular coil 50' is mounted annularly at two stages toward up and down directions. At an outer side of the annular coil 50', magnetic field shielding plates 45', 46' and 47' are provided. The waveguide tube 40' is connected to a microwave generating means 70' via a microwave guide tube 60'.

A nozzle 21' for introducing an etching gas is provided on the vacuum vessel 20', and this nozzle 21' is connected to an etching gas supply apparatus 90' via an etching gas introducing pipe 80'. A space 100' is formed between the vacuum vessel 20' and the discharge tube 30', and in this space a substrate electrode 110' is provided. A high frequency power source 120' is connected to the substrate electrode 110', and, moreover, an earth electrode 130' is provided on the grounded vacuum vessel 20'.

At the substrate electrode 110', a substrate member 140' is crimped and held by a substrate member holder 150' made of an insulating material. The space 100' is reduced in pressure to have a predetermined pressure, and is discharged by the evacuating apparatus 10''.

Employing this apparatus, a member having an aluminum film composed of Al-1%Si-0.5%Cu was subjected to dry etching. The gas mixture used as the etching gas was composed of $CH_3OH$ (200 cc/min) and $Cl_2$ (90 cc/min). Other conditions of processing included a gas pressure of 16 mTorr, a microwave electric power of 1 KW, and a high frequency electric power of 90 W. When conducting the processing, etching characteristics as shown in the following Table 1 were obtained.

TABLE 1

|  | etching gas | etching speed (nm/min) | resist selection ratio | SiO$_2$ selection ratio |
|---|---|---|---|---|
| prior art | $BCl_3$ + $Cl_2$ | 900-1000 | 2-3 | 12 |
| present invention | $CH_3OH$ + $Cl_2$ | 900-1000 | 3.5-4 | 12 |

As understood from the results of Table 1, a resist selection ratio between Al and a photo-resist improved remarkably to be between 3.5 and 4, which is 1.3-1.7 times that when utilizing the prior art gas mixture. According to this embodiment, even during effecting an etching processing of a stage-like structure portion having 2-3 times an etching film thickness, there is no elimination of the resist, and it is possible to form acute patterning.

Accordingly, by the present invention, use of a gas mixture of a halogen system gas and ROH, for forming the plasma for the etching-processing, has an effect that a film of aluminum system material can be etching-processed with a good shape, regardless of pattern density. Furthermore, the film of the aluminum system material can be etching-processed with small difference in etching speed, irrespective of the pattern density. Moreover, since only a relatively low bias voltage need be applied, according to the present invention, a selection ratio between (1) the film of the aluminum system material, and (2) material of the mask or of a base below the film, can be improved.

While we have shown and described several embodiments in accordance with the present invention, it is understood that the same is not limited thereto, but is susceptible to numerous changes and modification as known to one having ordinary skill in the art, and we therefore do not wish to be limited to the details shown and described herein, but intend to cover all such modifications as are encompassed by the scope of the appended claims.

We claim:

1. A method of dry-etching a sample, comprising the steps of:
   providing a sample, to be dry-etched, in a plasma etching chamber, the sample including an aluminum system film structure to be dry-etched, as at least a portion of the sample to be dry-etched; and
   plasma etching the sample in a plasma formed from a gas mixture of a halogen system gas and a ROH gas, R being a carbon-containing chain.

2. A method according to claim 1, where said halogen system gas is at least one halogen-containing gas selected from the group consisting of $BCl_3$, $Cl_2$, HBr, $Br_2$ and $BBr_3$.

3. A method according to claim 2, wherein said ROH gas is at least one gas selected from the group consisting of $CH_3OH$, $C_3H_5OH$ and $C_5H_7OH$.

4. A method according to claim 3, wherein said aluminum system film structure is selected from the group consisting of a layer of aluminum, a layer of aluminum alloy, a multi-layer film including a layer of aluminum and a layer of a barrier metal, and a multi-layer film including a layer of aluminum alloy and a layer of a barrier metal.

5. A method according to claim 4, wherein the ROH gas is included in the gas mixture in a concentration of 5-15% by volume of the total volume of the gas mixture.

6. A method according to claim 5, wherein the sample, during the plasma etching thereof, has a mask on a surface thereof to be dry-etched, surface portions of the sample, not covered by the mask, being etched.

7. A method according to claim 6, wherein the mask is made of an organic resist.

8. A method according to claim 1, wherein, for ROH gas, $R=C_nH_m$, with n=1-3 inclusive, and $m=2n\pm 1$.

9. A method according to claim 1, wherein the ROH gas is selected from the group consisting of $CH_3COOH$ and $HOCH_2CH_2OH$.

10. A method according to claim 1, wherein the ROH gas is included in the gas mixture in a concentration of 5-15% by volume of the total volume of the gas mixture.

11. A method according to claim 1, wherein the sample, during the plasma etching thereof, has a mask on a surface thereof to be dry-etched, surface portions of the sample, not covered by the mask, being etched.

12. A method according to claim 11, wherein the mask is made of an organic resist.

13. A method according to claim 1, wherein said ROH gas is at least one gas selected from the group consisting of $CH_3OH$, $C_3H_5OH$ and $C_5H_7OH$.

14. A method according to claim 1, wherein said aluminum system film structure is selected from the group consisting of a layer of aluminum, a layer of aluminum alloy, a multi-layer film including a layer of aluminum and a layer of a barrier metal, and a multi-layer film including a layer of aluminum alloy and a layer of a barrier metal.

15. A method of dry-etching a sample, comprising the steps of:
   providing a sample, to be dry-etched, on a sample table in a plasma etching chamber, the sample including an aluminum system film structure, to be dry-etched, forming at least a part of the sample to be dry-etched;
   forming a plasma in the plasma chamber, from a gas mixture comprising a halogen system gas and a ROH gas, R being a carbon-containing chain, under a reduced pressure condition; and
   plasma etching the sample using said plasma.

16. A method according to claim 15, wherein during said plasma etching a high frequency electric power is applied to said sample table to cause a bias voltage, thereby to control incidence of ions, in the plasma, on the sample.

17. A method according to claim 16, wherein said plasma is formed by an action between (1) an electric field created by microwaves and (2) a magnetic field.

18. A method according to claim 17, where said halogen system gas is at least one halogen-containing gas selected from the group consisting of $BCl_3$, $Cl_2$, HBr, $Br_2$ and $BBr_3$.

19. A method according to claim 18, wherein said ROH gas is at least one gas selected from the group consisting of $CH_3OH$, $C_3H_5OH$ and $C_5H_7OH$.

20. A method according to claim 19, wherein said aluminum system film structure is selected from the group consisting of a layer of aluminum, a layer of aluminum alloy, a multi-layer film including a layer of aluminum and a layer of a barrier metal, and a multi-layer film including a layer of aluminum alloy and a layer of a barrier metal.

21. A method according to claim 20, wherein the ROH gas is included in the gas mixture in a concentration of 5-15% by volume of the total volume of the gas mixture.

22. A method according to claim 21, wherein the sample, during the plasma etching thereof, has a mask on a surface thereof to be dry-etched, surface portions of the sample, not covered by the mask, being etched.

23. A method according to claim 22, wherein the mask is made of an organic resist.

24. A method according to claim 20, wherein the reduced pressure condition is 5-16 mTorr, a microwave power forming the microwaves is 200-400 mA, and the bias voltage is −40 to −50 V.

25. A method according to claim 20, wherein said gas mixture includes $BCl_3$, $Cl_2$ and $C_3H_5OH$.

26. A method according to claim 25, wherein said sample is either an 8 inch wafer or a 6 inch wafer, and wherein a gas supply amount of the gas mixture supplied into the plasma etching chamber during dry etching of the 8 inch wafer is greater than a gas supply amount of the gas mixture supplied into the plasma etching chamber during dry etching of the 6 inch wafer.

27. A method according to claim 17, wherein the reduced pressure condition is 5-16 mTorr, a microwave power forming the microwaves is 200-400 mA, and the bias voltage is −40 to −50 V.

28. A method according to claim 27, wherein said gas mixture includes $BCl_3$, $Cl_2$ and $C_3H_5OH$.

29. A method according to claim 28, wherein said sample is either an 8 inch wafer or a 6 inch wafer, and where supply amount of the gas mixture supplied into the plasma etching chamber during dry etching of the 8 inch wafer is greater than a gas supply amount of the gas mixture supplied into the plasma etching chamber during dry etching of the 6 inch wafer.

30. A method of dry-etching a sample, comprising the steps of:
   providing a sample, to be dry-etched, in a plasma etching chamber, the sample including an aluminum system film structure, to be dry-etched, as at least a portion of the sample to be dry-etched; and plasma etching the sample in a plasma formed from a gas mixture of $CH_3OH$ and $Cl_2$, the plasma acting to etch the aluminum system film structure.

31. A method according to claim 30, wherein the plasma etching is performed under reduced pressure.

32. A method according to claim 31, wherein said aluminum system film structure is a film of aluminum or a film of an alloy of aluminum.

33. A method according to claim 32, wherein the sample, during the plasma etching thereof, has a mask on a surface thereof to be dry-etched, surface portions of the sample, not covered by the mask, being etched.

34. A method according to claim 33, wherein the mask is made of an organic resist.

35. A method according to claim 34, wherein the $CH_3OH$ gas is included in the gas mixture in a concentration of 5–15% by volume of the total volume of the gas mixture.

* * * * *